US010559965B2

(12) United States Patent
Dunn et al.

(10) Patent No.: US 10,559,965 B2
(45) Date of Patent: Feb. 11, 2020

(54) DISPLAY ASSEMBLY HAVING MULTIPLE CHARGING PORTS

(71) Applicant: Manufacturing Resources International, Inc., Alpharetta, GA (US)

(72) Inventors: William Dunn, Alpharetta, GA (US); Douglas Bennett, Alpharetta, GA (US)

(73) Assignee: MANUFACTURING RESOURCES INTERNATIONAL, INC., Alpharetta, GA (US)

( * ) Notice: Subject to any disclaimer, the term of this patent is extended or adjusted under 35 U.S.C. 154(b) by 0 days.

(21) Appl. No.: 16/137,675

(22) Filed: Sep. 21, 2018

(65) Prior Publication Data

US 2019/0089176 A1 Mar. 21, 2019

Related U.S. Application Data

(60) Provisional application No. 62/561,504, filed on Sep. 21, 2017.

(51) Int. Cl.
*H05K 7/02* (2006.01)
*H05K 7/04* (2006.01)
(Continued)

(52) U.S. Cl.
CPC .............. *H02J 7/0045* (2013.01); *G09F 9/30* (2013.01); *G09F 27/00* (2013.01); *H02J 7/0027* (2013.01);
(Continued)

(58) Field of Classification Search
USPC ........................................................ 361/807
See application file for complete search history.

(56) References Cited

U.S. PATENT DOCUMENTS

| 4,093,355 A | 6/1978 | Kaplit et al. |
| 4,593,978 A | 6/1986 | Mourey et al. |

(Continued)

FOREIGN PATENT DOCUMENTS

| AU | 2011248190 B2 | 5/2011 |
| AU | 2014287438 B2 | 1/2018 |

(Continued)

OTHER PUBLICATIONS

Itsenclosures, Product Catalog, 2009, 48 pages.
(Continued)

*Primary Examiner* — Hung S. Bui
(74) *Attorney, Agent, or Firm* — Standley Law Group LLP; Jeffrey S. Standley; Adam J. Smith

(57) ABSTRACT

An electronic display assembly includes a housing with a pass-through device which accepts a utility line. One or more electronic display subassemblies are placed within said housing and a are surrounded by a substantially sealed closed loop pathway. An open loop pathway permits ambient air to pass through said housing and thermally interact with said closed loop pathway without mixing. At least two peripheral devices are located within said housing, one of which is a charging subassembly and the other is selected from the group consisting of: a camera, a touchscreen, an additional electronic display, video communications equipment, audio communications equipment, and an emergency notification subassembly.

19 Claims, 22 Drawing Sheets

(51) Int. Cl.
  *H02J 7/00*      (2006.01)
  *H05K 5/00*      (2006.01)
  *H05K 5/02*      (2006.01)
  *G09F 9/30*      (2006.01)
  *G09F 27/00*     (2006.01)
  *H05K 7/20*      (2006.01)
  *H01R 31/06*     (2006.01)

(52) U.S. Cl.
  CPC .......... *H02J 7/0054* (2013.01); *H05K 5/0004* (2013.01); *H05K 5/0017* (2013.01); *H05K 5/0086* (2013.01); *H05K 5/0226* (2013.01); *H05K 7/20954* (2013.01); *H01R 31/06* (2013.01); *H02J 2007/0062* (2013.01)

(56) References Cited

U.S. PATENT DOCUMENTS

| | | |
|---|---|---|
| 4,634,225 A | 1/1987 | Haim et al. |
| 4,748,765 A | 6/1988 | Martin |
| 4,763,993 A | 8/1988 | Vogeley et al. |
| 4,921,041 A | 5/1990 | Akachi |
| 4,952,783 A | 8/1990 | Aufderheide et al. |
| 4,952,925 A | 8/1990 | Haastert |
| 5,029,982 A | 7/1991 | Nash |
| 5,088,806 A | 2/1992 | McCartney et al. |
| 5,132,666 A | 7/1992 | Fahs |
| 5,247,374 A | 9/1993 | Terada |
| 5,282,114 A | 1/1994 | Stone |
| 5,293,930 A | 3/1994 | Pitasi |
| 5,351,176 A | 9/1994 | Smith et al. |
| 5,432,526 A | 7/1995 | Hyatt |
| 5,535,816 A | 7/1996 | Ishida |
| 5,559,614 A | 9/1996 | Urbish et al. |
| 5,621,614 A | 4/1997 | O'Neill |
| 5,657,641 A | 8/1997 | Cunningham et al. |
| 5,748,269 A | 5/1998 | Harris et al. |
| 5,765,743 A | 6/1998 | Sakiura et al. |
| 5,767,489 A | 6/1998 | Ferrier |
| 5,808,418 A | 9/1998 | Pitman et al. |
| 5,818,010 A | 10/1998 | McCann |
| 5,818,694 A | 10/1998 | Daikoku et al. |
| 5,835,179 A | 11/1998 | Yamanaka |
| 5,864,465 A | 1/1999 | Liu |
| 5,869,818 A | 2/1999 | Kim |
| 5,869,919 A | 2/1999 | Sato et al. |
| 5,903,433 A | 5/1999 | Gudmundsson |
| 5,991,153 A | 11/1999 | Heady et al. |
| 6,003,015 A | 12/1999 | Kang et al. |
| 6,007,205 A | 12/1999 | Fujimori |
| 6,089,751 A | 7/2000 | Conover et al. |
| 6,104,451 A | 8/2000 | Matsuoka et al. |
| 6,125,565 A | 10/2000 | Hillstrom |
| 6,157,432 A | 12/2000 | Helbing |
| 6,181,070 B1 | 1/2001 | Dunn et al. |
| 6,191,839 B1 | 2/2001 | Briley et al. |
| 6,198,222 B1 | 3/2001 | Chang |
| 6,204,906 B1 | 3/2001 | Tannas, Jr. |
| 6,211,934 B1 | 4/2001 | Habing et al. |
| 6,215,655 B1 | 4/2001 | Heady et al. |
| 6,351,381 B1 | 2/2002 | Bilski et al. |
| 6,380,999 B1 | 4/2002 | Tannas, Jr. |
| 6,392,727 B1 | 5/2002 | Larson et al. |
| 6,417,900 B1 | 7/2002 | Shin et al. |
| 6,428,198 B1 | 8/2002 | Saccomanno et al. |
| 6,473,150 B1 | 10/2002 | Takushima et al. |
| 6,493,440 B2 | 12/2002 | Gromatsky et al. |
| 6,504,713 B1 | 1/2003 | Pandolfi et al. |
| 6,535,266 B1 | 3/2003 | Nemeth et al. |
| 6,628,355 B1 | 9/2003 | Takahara |
| 6,701,143 B1 | 3/2004 | Dukach et al. |
| 6,714,410 B2 | 3/2004 | Wellhofer |
| 6,727,468 B1 | 4/2004 | Nemeth |
| 6,812,851 B1 | 11/2004 | Dukach et al. |
| 6,825,828 B2 | 11/2004 | Burke et al. |
| 6,839,104 B2 | 1/2005 | Taniguchi et al. |
| 6,850,209 B2 | 2/2005 | Mankins et al. |
| 6,885,412 B2 | 4/2005 | Ohnishi et al. |
| 6,886,942 B2 | 5/2005 | Okada et al. |
| 6,891,135 B2 | 5/2005 | Pala et al. |
| 6,909,486 B2 | 6/2005 | Wang et al. |
| 6,943,768 B2 | 9/2005 | Cavanaugh et al. |
| 6,961,108 B2 | 11/2005 | Wang et al. |
| 7,015,470 B2 | 3/2006 | Faytlin et al. |
| 7,059,757 B2 | 6/2006 | Shimizu |
| 7,083,285 B2 | 8/2006 | Hsu et al. |
| 7,157,838 B2 | 1/2007 | Thielemans et al. |
| 7,161,803 B1 | 1/2007 | Heady |
| 7,190,587 B2 | 3/2007 | Kim et al. |
| 7,209,349 B2 | 4/2007 | Chien et al. |
| 7,212,403 B2 | 5/2007 | Rockenfeller |
| 7,269,023 B2 | 9/2007 | Nagano |
| 7,284,874 B2 | 10/2007 | Jeong et al. |
| 7,452,121 B2 | 11/2008 | Cho et al. |
| 7,457,113 B2 | 11/2008 | Kumhyr et al. |
| 7,480,140 B2 | 1/2009 | Hara et al. |
| 7,525,633 B2 | 4/2009 | Tannas, Jr. |
| 7,535,543 B2 | 5/2009 | Dewa et al. |
| 7,535,547 B2 | 5/2009 | Tannas, Jr. |
| 7,602,469 B2 | 10/2009 | Shin |
| D608,775 S | 1/2010 | Leung |
| 7,667,964 B2 | 2/2010 | Kang et al. |
| 7,682,047 B2 | 3/2010 | Hsu et al. |
| 7,708,233 B2 | 5/2010 | Tannas, Jr. |
| 7,752,858 B2 | 7/2010 | Johnson et al. |
| 7,753,567 B2 | 7/2010 | Kang et al. |
| 7,780,492 B2 | 8/2010 | Tannas, Jr. |
| 7,800,706 B2 | 9/2010 | Kim et al. |
| 7,813,124 B2 | 10/2010 | Karppanen |
| 7,903,416 B2 | 3/2011 | Chou |
| D635,614 S | 4/2011 | Yan |
| 7,938,051 B2 | 5/2011 | Tannas |
| 7,995,342 B2 | 8/2011 | Nakamichi et al. |
| 8,004,648 B2 | 8/2011 | Dunn |
| 8,035,968 B2 | 10/2011 | Kwon et al. |
| 8,081,465 B2 | 12/2011 | Nishiura |
| 8,102,173 B2 | 1/2012 | Merrow |
| 8,142,027 B2 | 3/2012 | Sakai |
| D657,421 S | 4/2012 | Yan |
| D657,422 S | 4/2012 | Yan |
| 8,208,115 B2 | 6/2012 | Dunn |
| 8,223,311 B2 | 7/2012 | Kim et al. |
| 8,241,573 B2 | 8/2012 | Banerjee et al. |
| 8,248,784 B2 | 8/2012 | Nakamichi et al. |
| 8,254,121 B2 | 8/2012 | Lee et al. |
| 8,269,916 B2 | 9/2012 | Ohkawa |
| 8,270,163 B2 | 9/2012 | Nakamichi et al. |
| 8,274,622 B2 | 9/2012 | Dunn |
| 8,274,789 B2 | 9/2012 | Nakamichi et al. |
| D669,938 S | 10/2012 | Lard et al. |
| 8,300,203 B2 | 10/2012 | Nakamichi et al. |
| 8,320,119 B2 | 11/2012 | Isoshima et al. |
| 8,335,089 B2 * | 12/2012 | Takahashi ................. H05K 5/02 361/755 |
| 8,351,014 B2 | 1/2013 | Dunn |
| 8,358,397 B2 | 1/2013 | Dunn |
| 8,369,083 B2 | 2/2013 | Dunn et al. |
| 8,373,841 B2 | 2/2013 | Dunn |
| 8,379,182 B2 | 2/2013 | Dunn |
| 8,400,608 B2 | 3/2013 | Takahashi et al. |
| 8,472,174 B2 | 6/2013 | Idems et al. |
| 8,472,191 B2 | 6/2013 | Yamamoto et al. |
| 8,482,695 B2 | 7/2013 | Dunn |
| 8,497,972 B2 | 7/2013 | Dunn et al. |
| 8,649,170 B2 | 2/2014 | Dunn et al. |
| 8,649,176 B2 | 2/2014 | Okada et al. |
| 8,654,302 B2 | 2/2014 | Dunn et al. |
| 8,678,603 B2 | 3/2014 | Zhang |
| 8,693,185 B2 | 4/2014 | Dunn et al. |
| 8,700,226 B2 | 4/2014 | Schuch et al. |
| 8,711,321 B2 | 4/2014 | Dunn et al. |
| D704,265 S | 5/2014 | Yan |
| 8,749,749 B2 | 6/2014 | Hubbard |
| 8,755,021 B2 | 6/2014 | Hubbard |

(56) References Cited

U.S. PATENT DOCUMENTS

| | | |
|---|---|---|
| 8,760,613 B2 | 6/2014 | Dunn |
| 8,767,165 B2 | 7/2014 | Dunn |
| 8,773,633 B2 | 7/2014 | Dunn et al. |
| 8,804,091 B2 | 8/2014 | Dunn et al. |
| 8,823,916 B2 | 9/2014 | Hubbard et al. |
| 8,827,472 B2 | 9/2014 | Takada |
| 8,854,572 B2 | 10/2014 | Dunn |
| 8,854,595 B2 | 10/2014 | Dunn |
| 8,879,042 B2 | 11/2014 | Dunn |
| 8,988,647 B2 | 3/2015 | Hubbard |
| 9,030,641 B2 | 5/2015 | Dunn |
| 9,089,079 B2 | 7/2015 | Dunn |
| 9,119,325 B2 | 8/2015 | Dunn et al. |
| 9,119,330 B2 | 8/2015 | Hubbard et al. |
| 9,173,322 B2 | 10/2015 | Dunn |
| 9,173,325 B2 | 10/2015 | Dunn |
| 9,282,676 B1 | 3/2016 | Diaz |
| 9,285,108 B2 | 3/2016 | Dunn et al. |
| 9,313,917 B2 | 4/2016 | Dunn et al. |
| 9,370,127 B2 | 6/2016 | Dunn |
| 9,448,569 B2 | 9/2016 | Schuch et al. |
| 9,451,060 B1 | 9/2016 | Bowers et al. |
| 9,451,733 B2 | 9/2016 | Dunn et al. |
| 9,456,525 B2 | 9/2016 | Yoon et al. |
| 9,470,924 B2 | 10/2016 | Dunn et al. |
| 9,500,896 B2 | 11/2016 | Dunn et al. |
| 9,516,485 B1 | 12/2016 | Bowers et al. |
| 9,549,490 B2 | 1/2017 | Hubbard |
| 9,594,271 B2 | 3/2017 | Dunn et al. |
| 9,613,548 B2 | 4/2017 | DeMars |
| 9,622,392 B1 | 4/2017 | Bowers et al. |
| 9,629,287 B2 | 4/2017 | Dunn |
| 9,648,790 B2 | 5/2017 | Dunn et al. |
| 9,655,289 B2 | 5/2017 | Dunn et al. |
| 9,703,230 B2 | 7/2017 | Bowers et al. |
| 9,723,765 B2 | 8/2017 | DeMars |
| 9,797,588 B2 | 10/2017 | Dunn et al. |
| 9,801,305 B2 | 10/2017 | Dunn et al. |
| 9,823,690 B2 | 11/2017 | Bowers et al. |
| 9,835,893 B2 | 12/2017 | Dunn |
| 9,894,800 B2 | 2/2018 | Dunn |
| 2001/0001459 A1 | 5/2001 | Savant et al. |
| 2001/0019454 A1 | 9/2001 | Tadic-Galeb et al. |
| 2002/0009978 A1 | 1/2002 | Dukach et al. |
| 2002/0033919 A1 | 3/2002 | Sanelle et al. |
| 2002/0050793 A1 | 5/2002 | Cull et al. |
| 2002/0065046 A1 | 5/2002 | Mankins et al. |
| 2002/0084891 A1 | 7/2002 | Mankins et al. |
| 2002/0101553 A1 | 8/2002 | Enomoto et al. |
| 2002/0112026 A1 | 8/2002 | Fridman et al. |
| 2002/0126248 A1 | 9/2002 | Yoshia |
| 2002/0148600 A1 | 10/2002 | Bosch et al. |
| 2002/0149714 A1 | 10/2002 | Anderson et al. |
| 2002/0154255 A1 | 10/2002 | Gromatzky et al. |
| 2002/0164944 A1 | 11/2002 | Haglid |
| 2002/0164962 A1 | 11/2002 | Mankins et al. |
| 2002/0167637 A1 | 11/2002 | Burke et al. |
| 2003/0007109 A1 | 1/2003 | Park |
| 2003/0020884 A1 | 1/2003 | Okada et al. |
| 2003/0104210 A1 | 6/2003 | Azumi et al. |
| 2003/0128511 A1 | 7/2003 | Nagashima et al. |
| 2003/0214785 A1 | 11/2003 | Perazzo |
| 2004/0012722 A1 | 1/2004 | Alvarez |
| 2004/0035032 A1 | 2/2004 | Milliken |
| 2004/0035558 A1 | 2/2004 | Todd et al. |
| 2004/0036622 A1 | 2/2004 | Dukach et al. |
| 2004/0036834 A1 | 2/2004 | Ohnishi et al. |
| 2004/0103570 A1 | 6/2004 | Ruttenberg |
| 2004/0105159 A1 | 6/2004 | Saccomanno et al. |
| 2004/0165139 A1 | 8/2004 | Anderson et al. |
| 2004/0223299 A1 | 11/2004 | Ghosh |
| 2005/0012039 A1 | 1/2005 | Faytlin et al. |
| 2005/0012722 A1 | 1/2005 | Chon |
| 2005/0062373 A1 | 3/2005 | Kim et al. |
| 2005/0073632 A1 | 4/2005 | Dunn et al. |
| 2005/0073639 A1 | 4/2005 | Pan |
| 2005/0134525 A1 | 6/2005 | Tanghe et al. |
| 2005/0134526 A1 | 6/2005 | Willem et al. |
| 2005/0213950 A1 | 9/2005 | Yoshimura |
| 2005/0229630 A1 | 10/2005 | Richter et al. |
| 2005/0237714 A1 | 10/2005 | Ebermann |
| 2005/0276053 A1 | 12/2005 | Nortrup et al. |
| 2005/0286131 A1 | 12/2005 | Saxena et al. |
| 2006/0012958 A1 | 1/2006 | Tomioka et al. |
| 2006/0018093 A1 | 1/2006 | Lai et al. |
| 2006/0034051 A1 | 2/2006 | Wang et al. |
| 2006/0056994 A1 | 3/2006 | Van Lear et al. |
| 2006/0060732 A1 | 3/2006 | Tannas, Jr. |
| 2006/0082271 A1 | 4/2006 | Lee et al. |
| 2006/0092348 A1 | 5/2006 | Park |
| 2006/0125998 A1 | 6/2006 | Dewa et al. |
| 2006/0132699 A1 | 6/2006 | Cho et al. |
| 2006/0177587 A1 | 8/2006 | Ishizuka et al. |
| 2006/0199514 A1 | 9/2006 | Kimura |
| 2006/0209266 A1 | 9/2006 | Utsunomiya |
| 2006/0260790 A1 | 11/2006 | Theno et al. |
| 2006/0262079 A1 | 11/2006 | Seong et al. |
| 2006/0266499 A1 | 11/2006 | Choi et al. |
| 2006/0283579 A1 | 12/2006 | Ghosh et al. |
| 2007/0019419 A1 | 1/2007 | Hafuka et al. |
| 2007/0030879 A1 | 2/2007 | Hatta |
| 2007/0047239 A1 | 3/2007 | Kang et al. |
| 2007/0065091 A1 | 3/2007 | Hinata et al. |
| 2007/0076431 A1 | 4/2007 | Atarashi et al. |
| 2007/0103863 A1 | 5/2007 | Kim |
| 2007/0103866 A1 | 5/2007 | Park |
| 2007/0115686 A1 | 5/2007 | Tyberghien |
| 2007/0139929 A1 | 6/2007 | Yoo et al. |
| 2007/0140671 A1 | 6/2007 | Yoshimura |
| 2007/0151274 A1 | 7/2007 | Roche et al. |
| 2007/0151664 A1 | 7/2007 | Shin |
| 2007/0171353 A1 | 7/2007 | Hong |
| 2007/0206158 A1 | 9/2007 | Kinoshita et al. |
| 2007/0211205 A1 | 9/2007 | Shibata |
| 2007/0212211 A1 | 9/2007 | Chiyoda et al. |
| 2007/0217221 A1 | 9/2007 | Lee et al. |
| 2007/0237636 A1 | 10/2007 | Hsu |
| 2007/0267174 A1 | 11/2007 | Kim |
| 2007/0267554 A1 | 11/2007 | Tannas, Jr. |
| 2008/0055534 A1 | 3/2008 | Kawano |
| 2008/0076342 A1 | 3/2008 | Bryant et al. |
| 2008/0099193 A1 | 5/2008 | Aksamit et al. |
| 2008/0148609 A1 | 6/2008 | Ogoreve |
| 2008/0209934 A1 | 9/2008 | Richards |
| 2008/0218446 A1 | 9/2008 | Yamanaka |
| 2008/0236005 A1 | 10/2008 | Isayev et al. |
| 2008/0267790 A1 | 10/2008 | Gaudet et al. |
| 2008/0283234 A1 | 11/2008 | Sagi et al. |
| 2008/0285290 A1 | 11/2008 | Ohashi et al. |
| 2009/0009047 A1 | 1/2009 | Yanagawa et al. |
| 2009/0009729 A1 | 1/2009 | Sakai |
| 2009/0059518 A1 | 3/2009 | Kakikawa et al. |
| 2009/0086430 A1 | 4/2009 | Kang et al. |
| 2009/0120629 A1 | 5/2009 | Ashe |
| 2009/0122218 A1 | 5/2009 | Oh et al. |
| 2009/0126906 A1 | 5/2009 | Dunn |
| 2009/0126907 A1 | 5/2009 | Dunn |
| 2009/0126914 A1 | 5/2009 | Dunn |
| 2009/0135365 A1 | 5/2009 | Dunn |
| 2009/0147170 A1 | 6/2009 | Oh et al. |
| 2009/0154096 A1 | 6/2009 | Iyengar et al. |
| 2009/0174626 A1 | 7/2009 | Isoshima et al. |
| 2009/0227167 A1 | 9/2009 | Tannas, Jr. |
| 2009/0244472 A1 | 10/2009 | Dunn |
| 2009/0279240 A1 | 11/2009 | Karppanen |
| 2009/0302727 A1 | 12/2009 | Vincent et al. |
| 2009/0306820 A1 | 12/2009 | Simmons et al. |
| 2010/0060861 A1 | 3/2010 | Medin |
| 2010/0079949 A1 | 4/2010 | Nakamichi et al. |
| 2010/0162747 A1 | 7/2010 | Hamel et al. |
| 2010/0171889 A1 | 7/2010 | Pantel et al. |
| 2010/0182562 A1 | 7/2010 | Yoshida et al. |
| 2010/0213323 A1 | 8/2010 | Tannas, Jr. |
| 2010/0220249 A1 | 9/2010 | Nakamichi et al. |

(56) References Cited

U.S. PATENT DOCUMENTS

| | | |
|---|---|---|
| 2010/0226091 A1 | 9/2010 | Dunn |
| 2010/0232107 A1 | 9/2010 | Dunn |
| 2010/0238394 A1 | 9/2010 | Dunn |
| 2010/0297907 A1 | 11/2010 | Tannas, Jr. |
| 2010/0321887 A1 | 12/2010 | Kwon et al. |
| 2011/0001898 A1 | 1/2011 | Mikubo et al. |
| 2011/0013114 A1 | 1/2011 | Dunn et al. |
| 2011/0019363 A1 | 1/2011 | Vahlsing et al. |
| 2011/0051071 A1 | 3/2011 | Nakamichi et al. |
| 2011/0058326 A1 | 3/2011 | Idems et al. |
| 2011/0075361 A1 | 3/2011 | Nakamichi et al. |
| 2011/0083460 A1 | 4/2011 | Thomas et al. |
| 2011/0083824 A1 | 4/2011 | Rogers |
| 2011/0085301 A1 | 4/2011 | Dunn |
| 2011/0114384 A1 | 5/2011 | Sakamoto et al. |
| 2011/0116000 A1 | 5/2011 | Dunn et al. |
| 2011/0116231 A1 | 5/2011 | Dunn et al. |
| 2011/0122162 A1 | 5/2011 | Sato et al. |
| 2011/0141724 A1 | 6/2011 | Erion |
| 2011/0261523 A1 | 10/2011 | Dunn et al. |
| 2012/0006523 A1 | 1/2012 | Masahiro et al. |
| 2012/0012295 A1 | 1/2012 | Kakiuchi et al. |
| 2012/0012300 A1 | 1/2012 | Dunn et al. |
| 2012/0014063 A1 | 1/2012 | Weiss |
| 2012/0020114 A1 | 1/2012 | Miyamoto et al. |
| 2012/0038849 A1 | 2/2012 | Dunn et al. |
| 2012/0044217 A1 | 2/2012 | Okada et al. |
| 2012/0106081 A1 | 5/2012 | Hubbard et al. |
| 2012/0188481 A1 | 7/2012 | Kang et al. |
| 2012/0206687 A1 | 8/2012 | Dunn et al. |
| 2012/0249402 A1 | 10/2012 | Kang |
| 2012/0255704 A1 | 10/2012 | Nakamichi |
| 2012/0274876 A1 | 11/2012 | Cappaert et al. |
| 2012/0284547 A1 | 11/2012 | Culbert et al. |
| 2013/0170140 A1 | 7/2013 | Dunn |
| 2013/0173358 A1 | 7/2013 | Pinkus |
| 2013/0176517 A1 | 7/2013 | Kim et al. |
| 2013/0201685 A1 | 8/2013 | Messmore et al. |
| 2013/0258659 A1 | 10/2013 | Erion |
| 2013/0279154 A1 | 10/2013 | Dunn |
| 2013/0294039 A1 | 11/2013 | Chao |
| 2014/0044147 A1 | 2/2014 | Wyatt et al. |
| 2014/0085564 A1 | 3/2014 | Hendren et al. |
| 2014/0111758 A1 | 4/2014 | Dunn et al. |
| 2014/0113540 A1 | 4/2014 | Dunn et al. |
| 2014/0313698 A1 | 10/2014 | Dunn et al. |
| 2014/0314395 A1 | 10/2014 | Dunn et al. |
| 2015/0264826 A1 | 9/2015 | Dunn et al. |
| 2015/0319882 A1 | 11/2015 | Dunn et al. |
| 2015/0366101 A1 | 12/2015 | Dunn et al. |
| 2016/0041423 A1 | 2/2016 | Dunn |
| 2016/0044829 A1 | 2/2016 | Dunn |
| 2016/0192536 A1 | 6/2016 | Diaz |
| 2016/0195254 A1 | 7/2016 | Dunn et al. |
| 2016/0198588 A1 | 7/2016 | DeMars |
| 2016/0238876 A1 | 8/2016 | Dunn et al. |
| 2016/0242329 A1 | 8/2016 | DeMars |
| 2016/0242330 A1 | 8/2016 | Dunn |
| 2016/0249493 A1 | 8/2016 | Dunn et al. |
| 2016/0302331 A1 | 10/2016 | Dunn |
| 2017/0023823 A1 | 1/2017 | Dunn et al. |
| 2017/0068042 A1 | 3/2017 | Dunn et al. |
| 2017/0074453 A1* | 3/2017 | Bowers .................. G06F 1/16 |
| 2017/0083043 A1 | 3/2017 | Bowers et al. |
| 2017/0083062 A1 | 3/2017 | Bowers et al. |
| 2017/0111486 A1 | 4/2017 | Bowers et al. |
| 2017/0111520 A1 | 4/2017 | Bowers et al. |
| 2017/0111521 A1 | 4/2017 | Bowers et al. |
| 2017/0127579 A1 | 5/2017 | Hubbard |
| 2017/0140344 A1 | 5/2017 | Bowers et al. |
| 2017/0147992 A1 | 5/2017 | Bowers et al. |
| 2017/0163519 A1 | 6/2017 | Bowers et al. |
| 2017/0175411 A1 | 6/2017 | Bowers et al. |
| 2017/0188490 A1 | 6/2017 | Dunn et al. |
| 2017/0245400 A1 | 8/2017 | Dunn et al. |
| 2017/0257978 A1 | 9/2017 | Diaz |
| 2017/0332523 A1 | 11/2017 | DeMars |
| 2018/0042134 A1 | 2/2018 | Dunn et al. |

FOREIGN PATENT DOCUMENTS

| | | |
|---|---|---|
| CN | 2702363 Y | 5/2005 |
| CN | 107251671 A | 10/2017 |
| EP | 1408476 A1 | 4/2004 |
| EP | 1647766 A2 | 4/2006 |
| EP | 1762892 A1 | 3/2007 |
| EP | 1951020 A1 | 7/2008 |
| EP | 2225603 A2 | 9/2010 |
| EP | 2370987 A2 | 10/2011 |
| EP | 2603831 A2 | 6/2013 |
| EP | 2801888 A2 | 11/2014 |
| EP | 2909829 A1 | 8/2015 |
| EP | 3020260 A2 | 5/2016 |
| EP | 3117693 A2 | 1/2017 |
| EP | 3259968 A1 | 12/2017 |
| GB | 2402205 A | 12/2004 |
| JP | 402062015 A | 3/1990 |
| JP | 402307080 A | 12/1990 |
| JP | 3153212 A | 7/1991 |
| JP | H06-2337 U | 1/1994 |
| JP | 6082745 A | 3/1994 |
| JP | 8115788 A | 5/1996 |
| JP | 8194437 A | 7/1996 |
| JP | H08-305301 A | 11/1996 |
| JP | 8339034 A | 12/1996 |
| JP | H09246766 A | 9/1997 |
| JP | 11160727 A | 6/1999 |
| JP | H11296094 A | 10/1999 |
| JP | 2000010501 A | 1/2000 |
| JP | 2001209126 A | 8/2001 |
| JP | 2002158475 A | 5/2002 |
| JP | 2004053749 A | 2/2004 |
| JP | 2005017556 A | 1/2005 |
| JP | 2000131682 A | 5/2005 |
| JP | 2005134849 A | 5/2005 |
| JP | 2005265922 A | 9/2005 |
| JP | 2006513577 A | 4/2006 |
| JP | 2007322718 A | 5/2006 |
| JP | 2006148047 A | 6/2006 |
| JP | 2006163217 A | 6/2006 |
| JP | 2007003638 A | 1/2007 |
| JP | 2007-293105 A | 11/2007 |
| JP | 09307257 A | 11/2007 |
| JP | 2008010361 A | 1/2008 |
| JP | 2008292743 A | 12/2008 |
| JP | 2010024624 A | 2/2010 |
| JP | 2010102227 A | 5/2010 |
| JP | 2010-282109 A | 12/2010 |
| JP | 2011503663 A | 1/2011 |
| JP | 2011075819 A | 4/2011 |
| JP | 2012133254 A | 7/2012 |
| JP | 2013537721 A | 10/2013 |
| JP | 2014225595 A | 12/2014 |
| JP | 2017518526 A | 7/2017 |
| KR | 200366674 Y1 | 11/2004 |
| KR | 20050033986 A | 4/2005 |
| KR | 200401354 Y1 | 11/2005 |
| KR | 20060016469 A | 2/2006 |
| KR | 100666961 B1 | 1/2007 |
| KR | 1020070070675 B1 | 4/2007 |
| KR | 1020070048294 | 8/2007 |
| KR | 101764381 B1 | 7/2017 |
| RU | 2513043 C2 | 4/2014 |
| WO | WO2005079129 A1 | 8/2005 |
| WO | WO2008050660 A2 | 5/2008 |
| WO | WO2009065125 A2 | 5/2009 |
| WO | WO2009065125 A3 | 5/2009 |
| WO | WO2009135308 A1 | 11/2009 |
| WO | WO2010007821 A1 | 2/2010 |
| WO | WO2010080624 A2 | 7/2010 |
| WO | WO2011069084 A3 | 6/2011 |
| WO | WO2011072217 A3 | 6/2011 |
| WO | WO2011140179 A1 | 11/2011 |
| WO | WO2011150078 A2 | 12/2011 |

(56) References Cited

FOREIGN PATENT DOCUMENTS

| WO | WO2012021573 A2 | 2/2012 |
|---|---|---|
| WO | WO2012024426 A3 | 2/2012 |
| WO | 2013182733 A1 | 12/2013 |
| WO | WO2014149773 A1 | 9/2014 |
| WO | WO2014150036 A1 | 9/2014 |
| WO | WO2015168375 A1 | 11/2015 |
| WO | WO2016102982 A1 | 6/2016 |
| WO | 2016127613 A1 | 8/2016 |
| WO | WO2016133852 A1 | 8/2016 |
| WO | WO2017152166 A1 | 9/2017 |

OTHER PUBLICATIONS

Itsenclosures, Standard Product Data Sheet, 2011, 18 pages.
Sunbritetv, All Weather Outdoor LCD Television Model 4610HD, 2008, 1 page.
Sunbritetv, Introduces Two New All-Weather Outdoor Televisions InfoComm 2008, 7 pages.
Itsenclosures, Viewstation, 2017, 16 pages.
Novitsky, Driving LEDs versus CCFLs for LCD backlighting, Nov. 12, 2007, 6 pages.
Federman, Cooling Flat Panel Displays, 2011, 4 pages.
Zeeff, T.M., EMC analysis of an 18" LCD monitor, 2000, 1 page.
Vertigo Digital Displays, Innovation on Display FlexVu Totem Brochure, 2014, 6 pages.
Vertigo Digital Displays, FlexVu Totem Shelter, 2017, 2 pages.
Vertigo Digital Displays, All Products Catalogue, 2017,14 pages.
Adnation,Turn Key Advertising Technology Solutions, May 23, 2017, 4 pages.
CIVIQ Smartscapes, FlexVue Ferro 55P/55L, Mar. 16, 2017, 4 pages.
Wankhede, Evaluation of Cooling Solutions for Outdoor Electronics, Sep. 17-19, 2007, 6 pages.
Bureau of Ships Navy Department, Guide Manual of Cooling methods for Electronic Equipment, Mar. 31, 1955, 212 pages.
CIVIQ, Invalidity Claim Charts, Appendix A—Appendix D, Jan. 24, 2018, 51 pages.
CIVIQ, Invalidity Contentions, Jan. 24, 2018, 51 pages.
Scott, Cooling of Electronic Equipment, Apr. 4, 1947, 119 pages.
Sergent, Thermal Management Handbook for Electronic Assemblies, Aug. 14, 1998, 190 pages.
Steinberg, Cooling Techniques for Electronic Equipment First Edition, 1980, 255 pages.
Steinberg, Cooling Techniques for Electronic Equipment Second Edition, 1991, 299 pages.
Yeh, Thermal Management of Microelectronic Equipment, Oct. 15, 2002, 148 pages.

\* cited by examiner

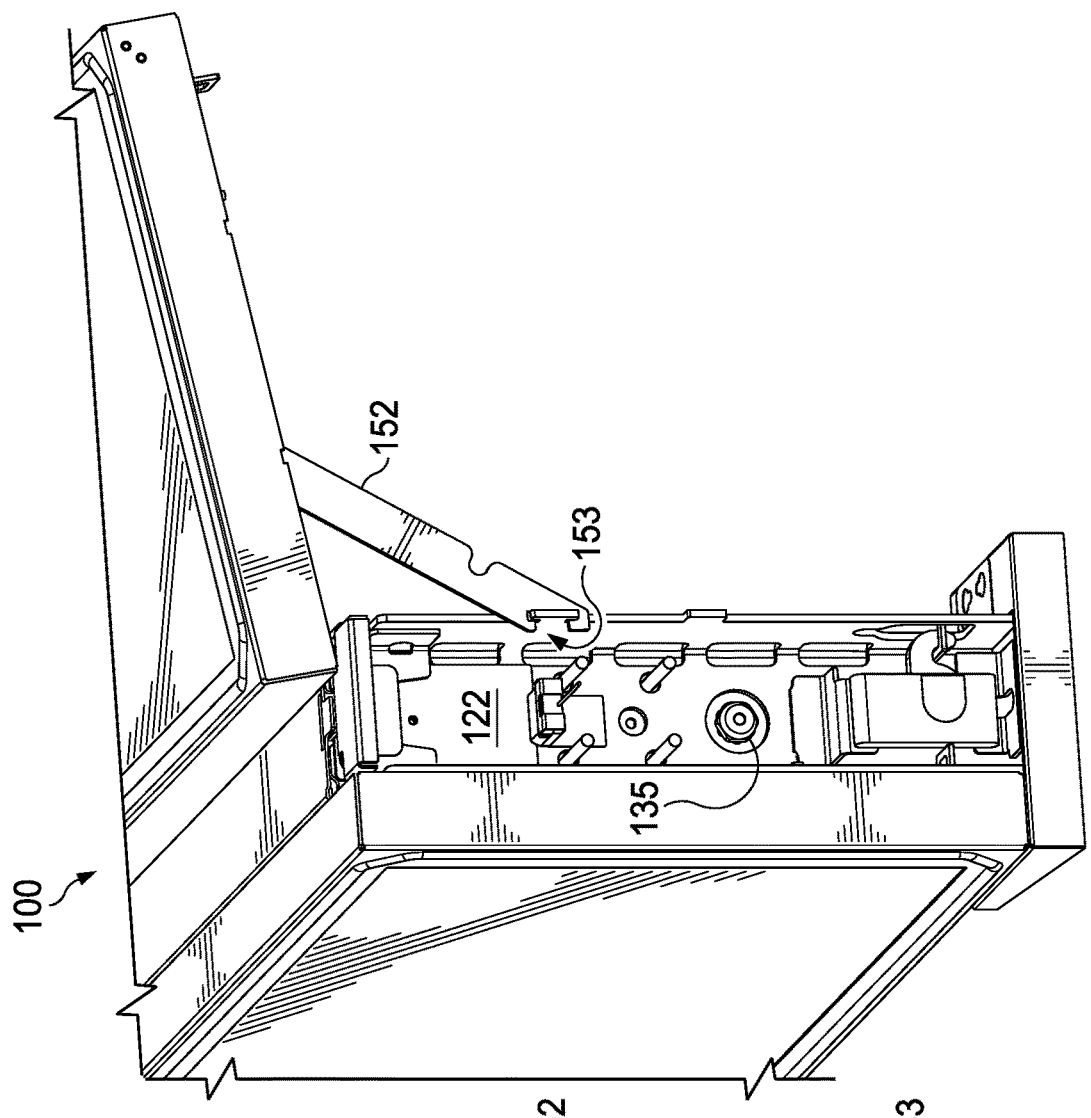
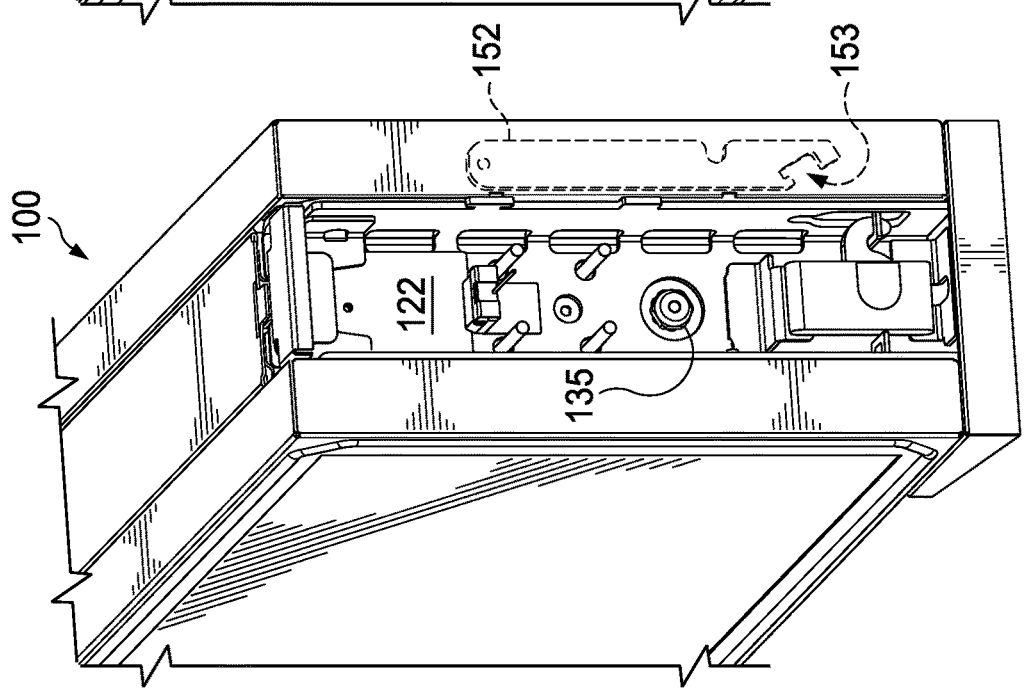

DISPLAY ASSEMBLY HAVING MULTIPLE CHARGING PORTS

CROSS-REFERENCE TO RELATED APPLICATION

This application claims the benefit of U.S. Provisional Patent Application Ser. No. 62/561,504 filed Sep. 21, 2017, the disclosure of which is hereby incorporated by reference in its entirety.

TECHNICAL FIELD

Exemplary embodiments of the present invention relate generally to assemblies for electronic displays.

BACKGROUND AND SUMMARY OF THE INVENTION

Electronic displays have grown in popularity not only for indoor use, but also for outdoor use. One exemplary application, without limitation, is the digital out of home advertising market where the electronic displays are increasingly replacing the use of static posters. The use of electronic displays is advantageous because they allow images to be changed quickly as well as permit the use of videos and interactive displays, among other benefits. Such displays have been placed in many locations, including but not limited, on billboards, the tops of vehicles, bus shelters, kiosks, sidewalks, stadiums, buildings, and the like.

Such outdoor and indoor display assemblies are often placed in areas of public gathering. It is desirable to add peripheral devices to such displays as such peripheral devices include desirable features that draw individuals to the assemblies or may facilitate data gathering regarding individuals near the assemblies. It is desirable to have individuals dwell or linger around the displays, particularly when the displays are showing advertisements, such that the individuals are exposed to additional content. Examples of such peripheral devices include, but are not limited to, cameras, touchscreens, additional screens, charging devices, emergency notification, and the like.

For example, without limitation, as the use of personal electronic devices has increased, the desire for public area charging stations has also increased. Such personal electronic devices need to be periodically recharged, which requires connectivity to a power source and time to allow the personal electronic device to charge. Adding charging devices to a display assembly can increase dwell time near the display assembly. In order to incentivize individuals to spend additional time in view of the display, what is needed is a display that also offers peripheral devices, such as but not limited to, the ability to charge personal electronic devices.

Additionally, these peripheral devices generally require access to an electrical power source and communications network to operate. Such peripheral devices generally comprise sensitive electronics which require particular temperature ranges and operating environments to function properly. As such, it is desirable to provide a substantially sealed, temperature regulated cavity within the assembly for said peripherical devices and their supporting electronic components so as to limit exposure to contaminants and the elements. Each peripheral device, of which there may be many in a single assembly, requires wiring to provide the electrical connection to said power source and communications equipment. Said wiring, however, must generally travel outside of the cavity to connect to the power source and/or communications equipment. Therefore, it is desirable to provide a wire harness that provides electrical connectivity to the peripheral devices by way of a substantially sealed entry point into the cavity. Additionally, the use of a wire harness provides organization and ease of connection/disconnection, particularly when servicing the display assembly.

The present invention is an assembly comprising a display assembly that offers a substantially sealed, temperature controlled cavity for peripheral devices and a substantially sealed entry point into the cavity. For example, without limitation, the assembly may comprise a charging subassembly located on a housing of the assembly. The charging subassembly may comprise various charging adapters that are configured to charge a variety of personal electronic devices. The charging adapters may be wired to a common power source that also powers the display. The charging adapters may extend from any part of the housing of said display assembly.

A wire harness may provide electrical connectivity to the peripheral devices and other components, such as but not limited to the charging subassembly, through an outlet or a pass-through device into the cavity. The wire harness may extend from the common power source and/or communications network along a frame within the housing of the assembly. The wire harness may enter the cavity via a substantially sealed pass-through device or be in electrical connection with a substantially sealed outlet located on the frame. Regardless, the outlet or pass through device may provide electrical connectivity to wiring located inside the cavity configured to provide power to the peripheral devices while substantially sealing the cavity from outside air or contaminants.

The wiring harness may also provide for tidy organization of the wires. It may also serve as a single connection/disconnection point for servicing the display. For example, without limitation, should an entire display assembly or component need replaced, the wire harness may provide a single wiring disconnection and reconnection as part of the removal process and replacement process.

BRIEF DESCRIPTION OF THE DRAWINGS

In addition to the features mentioned above, other aspects of the present invention will be readily apparent from the following descriptions of the drawings and exemplary embodiments, wherein like reference numerals across the several views refer to identical or equivalent features, and wherein:

FIG. 18A is a detailed perspective view of Detail B of FIG. 15 with the display assembly in the closed position and illustrating an otherwise hidden strut;

FIG. 18B is a detailed top perspective view of the assembly of FIG. 18A illustrated with the display assembly in the open position;

DETAILED DESCRIPTION OF EXEMPLARY EMBODIMENT(S)

Various embodiments of the present invention will now be described in detail with reference to the accompanying drawings. In the following description, specific details such as detailed configuration and components are merely provided to assist the overall understanding of these embodiments of the present invention. Therefore, it should be apparent to those skilled in the art that various changes and modifications of the embodiments described herein can be made without departing from the scope and spirit of the present invention. In addition, descriptions of well-known functions and constructions are omitted for clarity and conciseness.

Figure 1:
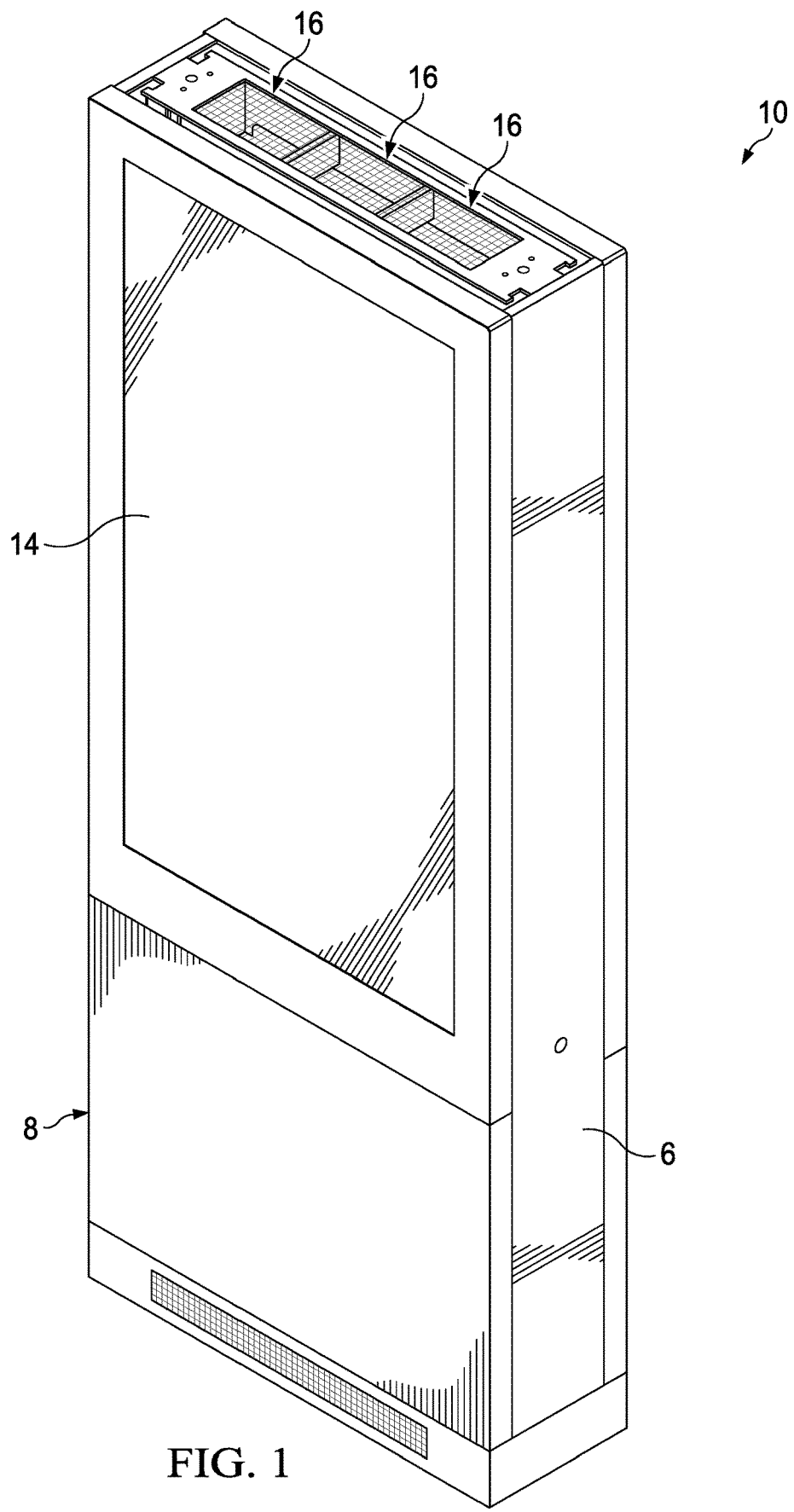
FIG. 1 is a front perspective view of an exemplary assembly in accordance with the present invention.

FIG. 1 is a front perspective view of an exemplary assembly 10 in accordance with the present invention. The assembly 10 may comprise one or more display assemblies 14 placed within a housing 6. The housing 6 may comprise a stand 8 for mounting the assembly 10 to the ground. However, in other exemplary embodiments, the assembly 10 may be mounted to another object such as, but not limited to, a bus shelter, a post, a wall, a building, or the like. Regardless, an intake 16 may be located on the top of the housing 6. As will be described in greater detail herein, an exhaust 9 may be located on the bottom of the housing 6. However, it is contemplated that the intake 16 may be located on the bottom of the housing 6 with the exhaust 9 being located on the top of the housing 6.

Figure 2:
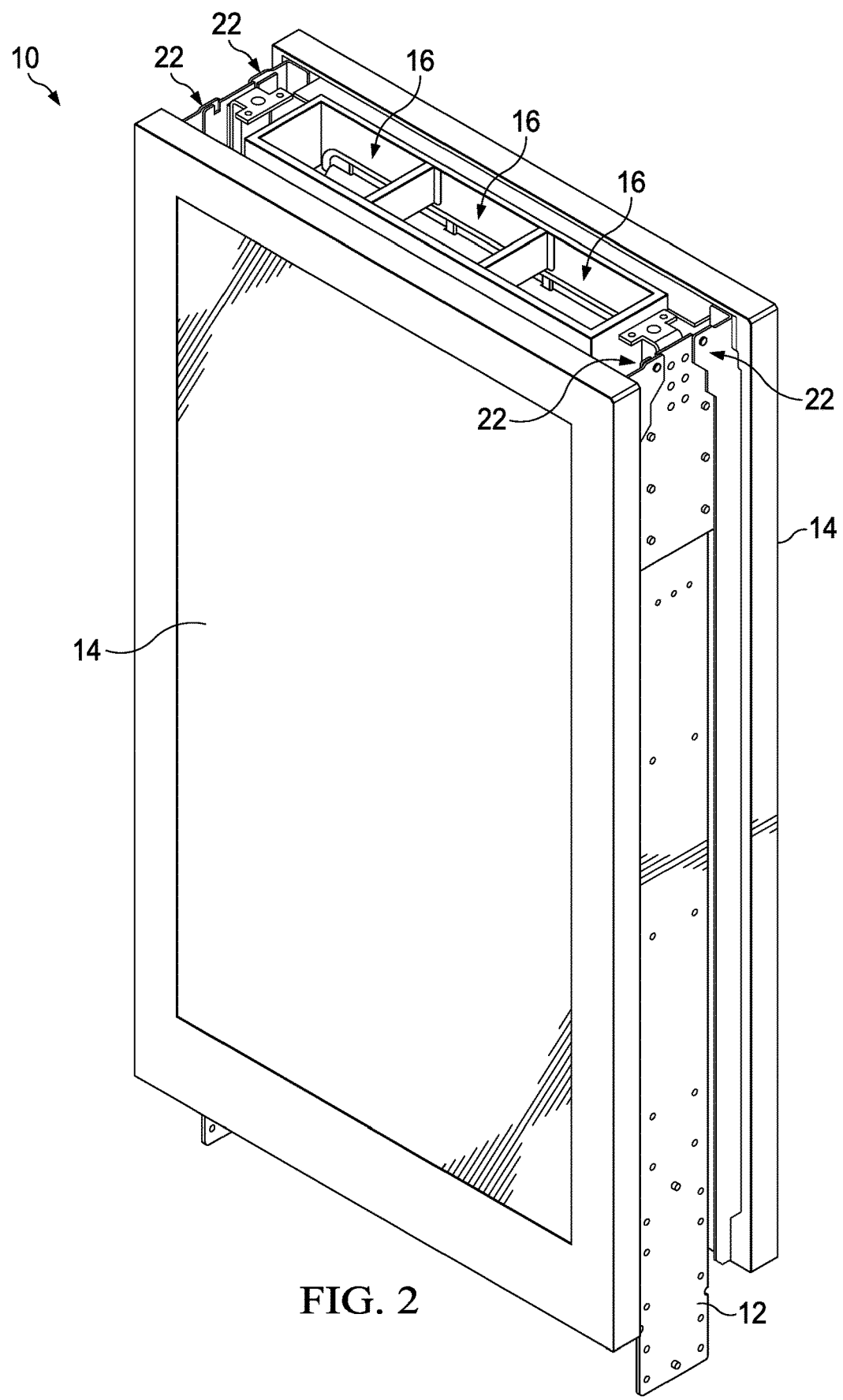
FIG. 2 is a front perspective of the assembly of FIG. 1 illustrated with the stand removed to illustrate additional components of the assembly.

FIG. 2 is a front perspective of the assembly 10 of FIG. 1 illustrated with the stand 6 removed to illustrate additional components of the assembly 10. The display assemblies 14 may be mounted to a frame 12. The frame 12 may be substantially rectangular in shape and may have interior and exterior surfaces or panels. In exemplary embodiments, the assembly 10 may comprise a single display assembly 14 mounted to the frame 12. In such embodiments, an access panel 48 may be mounted to the opposite side of the frame 12. As will be explained in greater detail herein, in exemplary embodiments the access panel 48 may be configured to receive a static poster. In other exemplary embodiments, the assembly 10 may comprise a first and a second display assembly 14 placed back-to-back on either side of the frame 12. Regardless, the frame 12 may be configured to be connected to the stand 8, another object, or directly to the ground.

As will be explained in greater detail herein, the assembly 10 may further comprise an electronics cavity 18 for storing electronic components 30 for operating the assembly 10. In the exemplary embodiments comprising the single display assembly 14, the electronics cavity 18 may located in the space between the display assembly 14, the frame 12, and the access panel 48. In other exemplary embodiments comprising the first and second display assemblies 14 placed back-to-back, the electronics cavity 18 may be located in the space between the display assemblies 14 and the frame 12. The first and second display assemblies 14 may share a common electronics cavity 18.

Regardless, the intake 16 may likewise extend through the frame 12. Similarly, the exhaust 9 may extend through the frame 12.

FIGS. 1 and 2 illustrate the display assemblies 14 in a closed position such that the display assemblies 14 are in contact with the frame 12 or are located substantially parallel to the ground. As will be explained in greater detail herein, the display assemblies 14 may be hingedly mounted to the frame 12 by way of a hinging device 22. A pair of hinging devices 22 may be located on either side of the frame 12. In the exemplary embodiments comprising the first and second display assemblies 14 located back-to-back, the same hinging devices 22 may be used to hingedly mount the first and the second display assemblies 14 to the frame 12, though such is not required. In exemplary embodiments, the hinging devices 22 may be located on an upper portion of the frame 12, though any location of the hinging devices 22 is contemplated.

Figure 3:
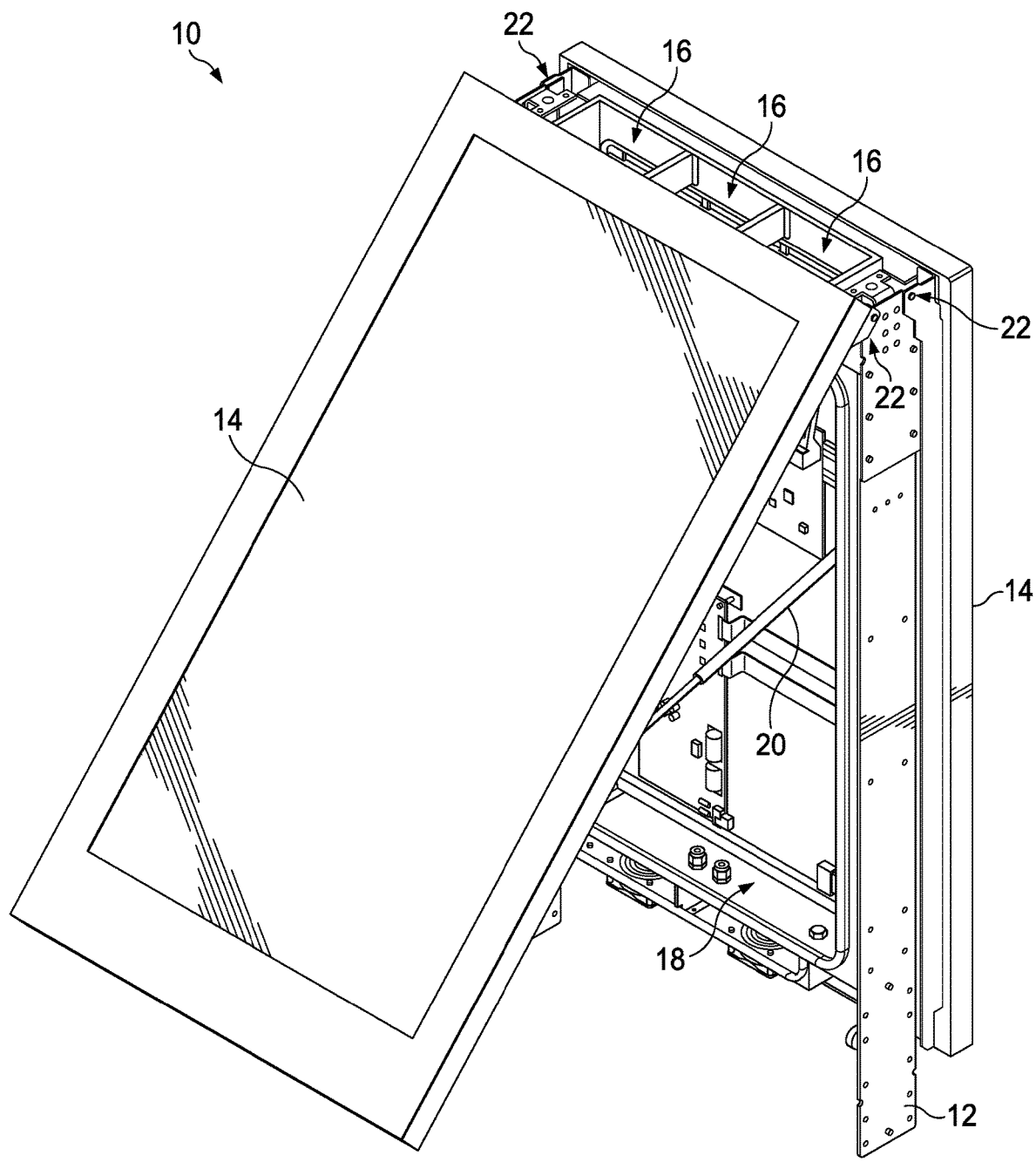
FIG. 3 is a front perspective of the assembly of FIG. 2 illustrated with one of the assemblies in the open position.

FIG. 3 is a front perspective view of the assembly 10 of FIG. 2 illustrated with one of the display assemblies 14 in an open position. The display assembly 14 may rotate via the hinging device 22 into the opened position such that the bottom of the display assembly 14 is swung outwardly away from the frame 12. This may allow access to the electronics cavity 18 such that personnel may inspect, maintain, repair, replace, or otherwise service the electronic components 30 located therein.

The assembly 10 may further comprise a pair of aid devices 20, preferably having a first end and a second end, though such is not required. In exemplary embodiments, the aid devices 20 may be gas springs, though any type of aid device is contemplated. Such aid devices 20 may include, but are not limited to, any device which utilizes a mechanical advantage in order to assist is moving the display assemblies 14 between an open position or closed positions as well as, or alternatively, to temporarily secure the display assemblies 14 in the open position or closed position. Other exemplary aid devices 20 include, but are not limited to, struts, springs, block and tackle, counterweights, levers, gears, tethers, belts, chains, motors, screws, some combination thereof, or the like.

The first end of the aid devices 20 may be mounted to either side of the display assembly 14 and the second end of the aid devices 20 may be mounted to either side of the interior of the frame 12. In exemplary embodiments, the first end of the aid devices 20 is mounted lower relative to second end of the aid devices 20, though the opposite is contemplated. The aid devices 20 may be configured to assist with movement of the display assemblies 14 between the open and the closed positions as well as temporarily securing the display assemblies 14 in the opened or the closed positions.

In exemplary embodiments, the display assemblies 14 may be lockable to the frame 12 or the housing 6 such that the display assemblies 14 cannot normally be moved from the closed position unless unlocked. This may assist in restricting access to the electronics cavity 18 to authorized personnel.

For clarity, in exemplary embodiments where back-to-back display assemblies 14 are used, each of the first and the second display assembly 14 may comprise a first and second aid device 20 such that each of the display assemblies 14 may be moved between, or selectively secure in, the opened and the closed position. In exemplary embodiments where a single display assembly 14 is used, the display assembly 14 may comprise the first and second aid devices 20 such that the display assembly 14 may be moved between, or be selectively secured in, the opened and the closed position. In such embodiments, the access panel 48 may form the rear surface of the assembly 10 and may be swung outwardly and/or upwardly to allow access to the electronics cavity 18 as described in greater detail herein, though any direction of rotation or movement is contemplated.

Figure 4:
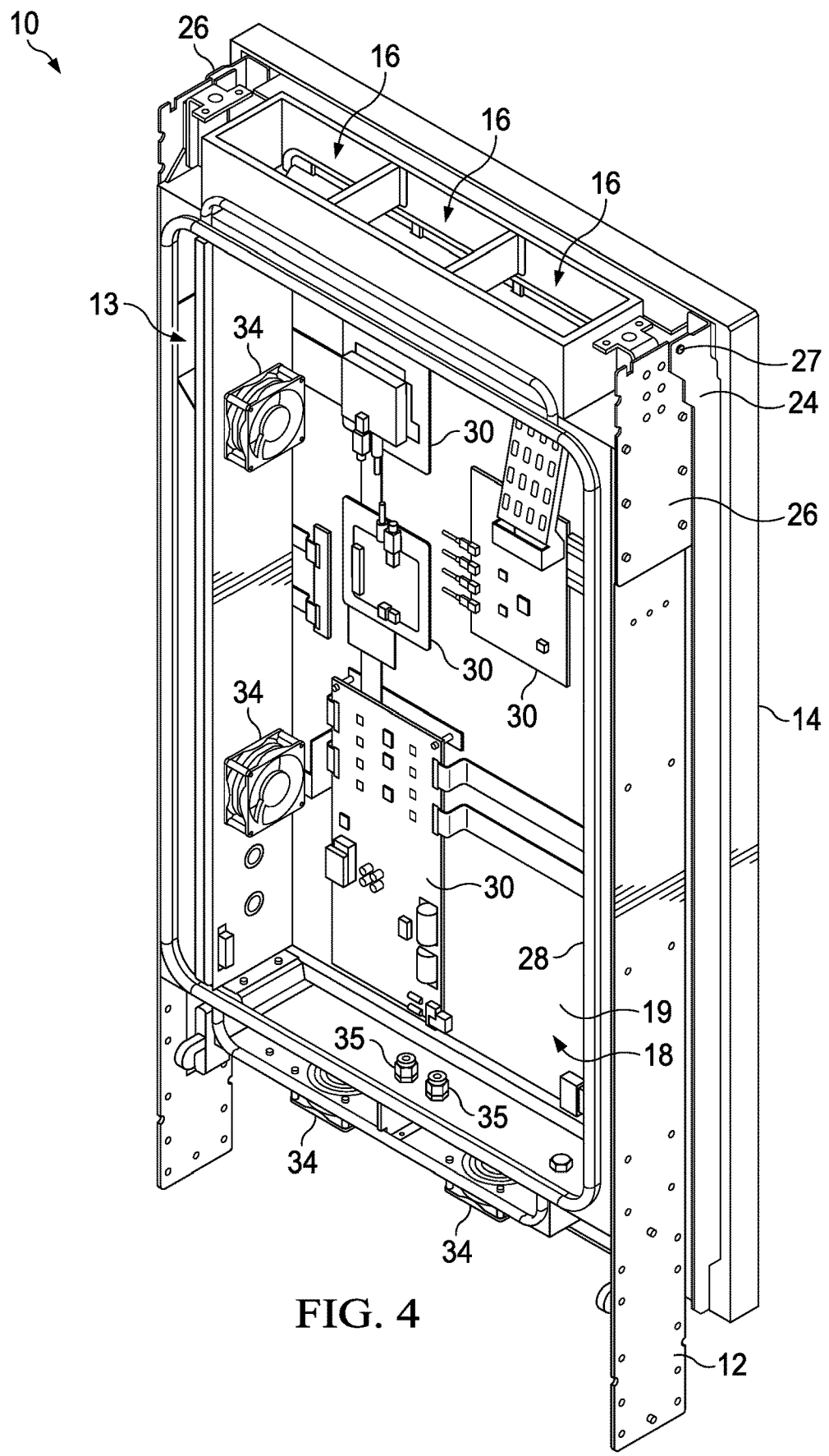
FIG. 4 is a front perspective view of the assembly of FIG. 2 illustrated with one of the assemblies removed.

FIG. 4 is a front perspective view of the assembly 10 of FIG. 2 illustrated with one of the display assemblies 14 removed so as to illustrate the electronics cavity 18. A gasket 28 may extend around the perimeter of either side of the frame 12. In exemplary embodiments where the first and second display assemblies 14 are placed back to back, the gaskets 28 may provide a substantially air tight seal when the display assemblies 14 are placed in the closed position. In exemplary embodiments where a single display assembly 14 is used, the gaskets 28 may provide a substantially air tight seal when the display assembly 14 and the access panel 48 are placed in the closed position. Regardless, this may allow the electronics cavity 18 to be sealed substantially air tight, though such is not required.

A plate 19 may be located in the electronics cavity 18 and the electronic components 30 may be mounted thereto. In exemplary embodiments, the plate 19 may be mounted to the frame 12 such that the plate 19 extends substantially parallel to the front surface of the electronic display assemblies 14 when the electronic display assemblies 14 are located in the closed position. Stated another way, the plate 19 may extend substantially perpendicular to the ground.

The electronic components 30 may comprise any number of components used to operate the assembly 10 and its various components. Such electronic components 30 may include, but are not limited to, power sources, power distribution components, video players, video receiver boards, processors, electronic storage devices, communications equipment, wireless transmitter/receivers, network connectivity devices, printed circuit boards, and the like. In exemplary embodiments, a number of the electronic components 30 may be utilized to operate both display assemblies 14 (in the embodiments where two display assemblies 14 are used). For example, but not to serve as a limitation, at least the video players, video receiver boards, communications equipment, wireless transmitter/receivers, and network connectivity devices may be shared. This may reduce the number of electronic components 30 required. In exemplary embodiments, the plate 19 may be a server rack, though such is not required.

The hinging device 22 may comprise a frame hinge plate 26 and a display hinge plate 24. The frame hinge plate 26 may be located on the exterior panels on either side of an upper portion of the frame 12 such that the frame hinge plate 26 extends substantially perpendicular relative to the plate 19. The frame hinge plate 26 may comprise one or more notches or apertures for mounting the display hinge plate 24 thereto. The display hinge plate 24 may be located on either side of an upper portion of the display assembly 14 such that the display hinge plate 26 extends substantially perpendicular relative to the plate 19. The display hinge plate 24 may comprise one or more notches or apertures corresponding to the notches or apertures located in the frame hinge plate 26. Any number of fasteners 27 may extend through the corresponding notches or apertures in the display hinge plate 24 and the frame hinge plate 26 such that the frame hinge plate 26 may be hingedly secured to the display hinge plate 24. The fasteners 27 may include a threaded fastener, pin, or the like. This is merely exemplary, any type of hinge device 22 is contemplated.

The design of the hinge device 22 may provide for easy removal of one or both of the display assemblies 14 when performing inspections, maintenance, repairs, replacements, or otherwise servicing the assembly 10. The fasteners 27 may simply be removed from either side of the display assembly 14 and the entire display assembly 14 may be removed. A replacement display assembly 14 may then be installed. The display assembly 14 being inspected, maintained, repaired, replaced, or otherwise serviced may then be returned to a service center for servicing. This may minimize downtime of the assembly 10.

Figure 5:
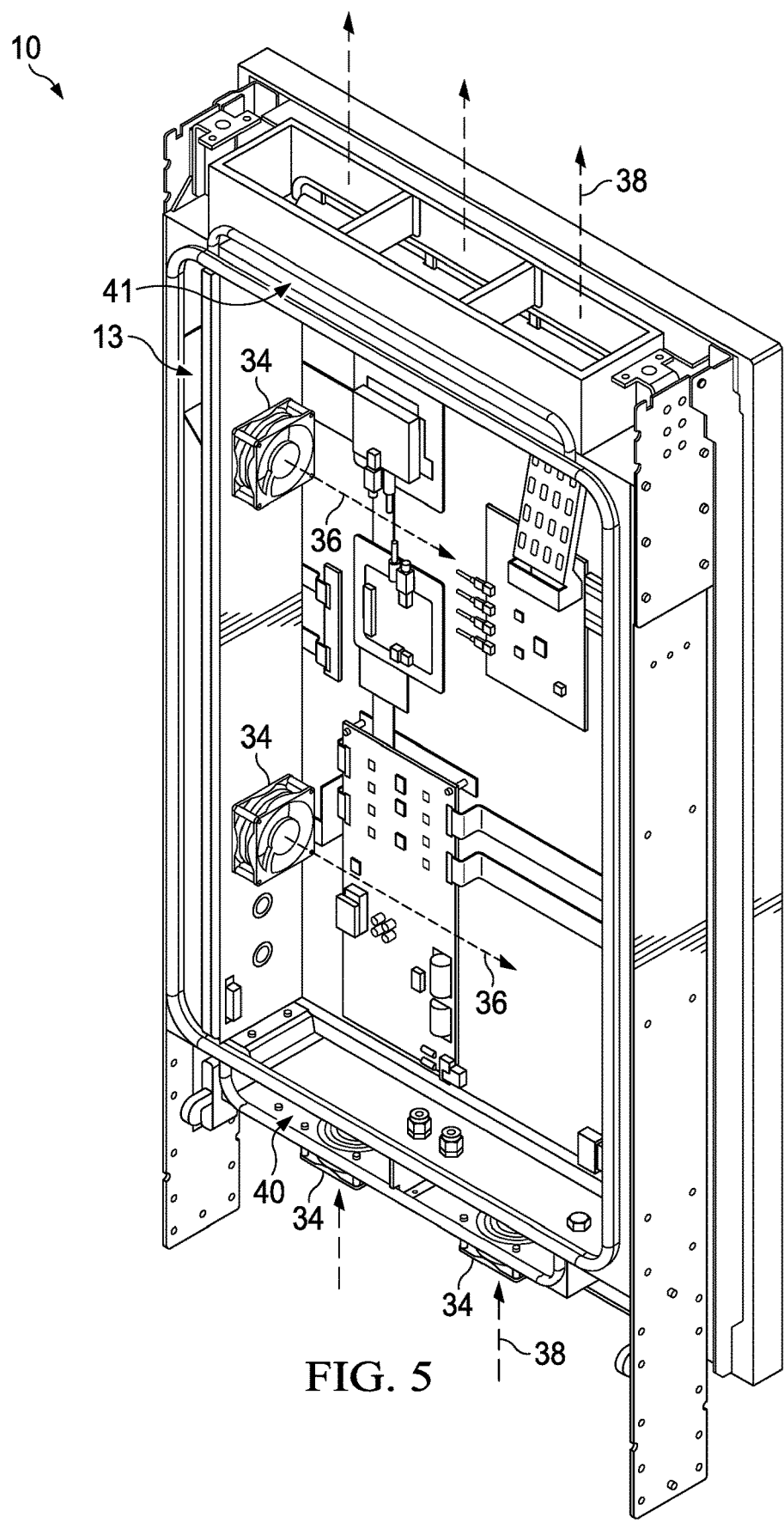
FIG. 5 is a front perspective view of the assembly of FIG. 4, illustrated with exemplary flow paths for circulating gas and ambient air.
Figure 6:
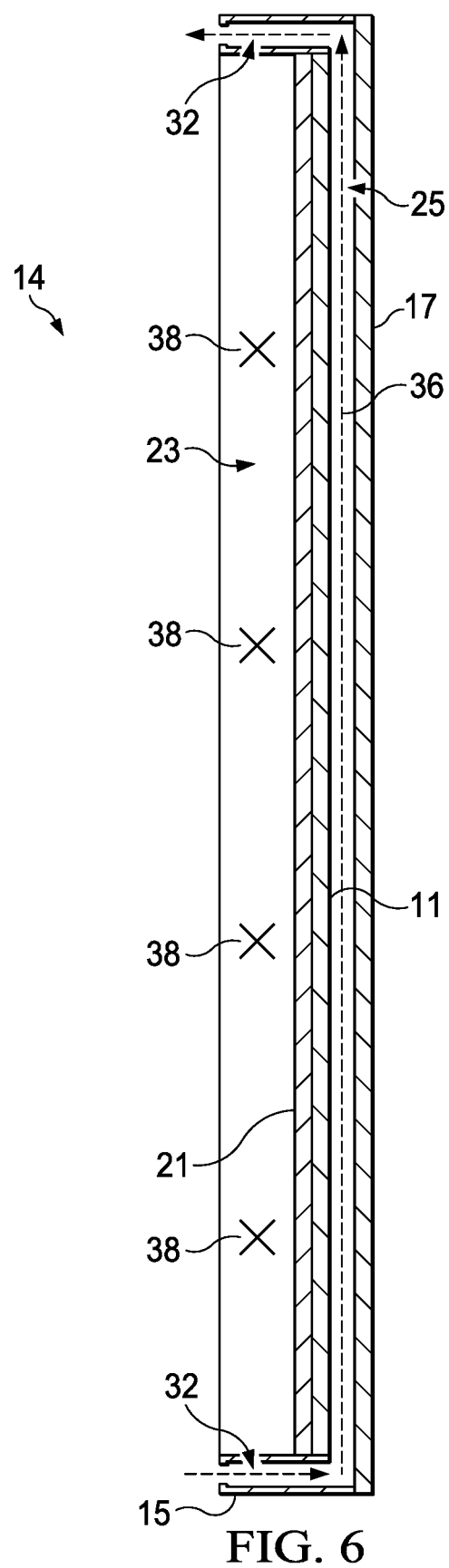
FIG. 6 is a top sectional view of an exemplary display assembly illustrated in isolation from other components to illustrate exemplary flow paths for circulating gas and ambient air.

FIG. 5 illustrates exemplary flow paths through the assembly 10 of FIG. 4. FIG. 6 illustrates a top sectional view of an exemplary display assembly 14 to further illustrate said exemplary flow paths. Each display assembly 14 may comprise a cover panel 17 that faces an intended viewer. An electronic display 11 may be located behind, spaced apart from, and substantially parallel to the cover panel 17. Cover panel 17 may be comprised of any substantially transparent or translucent material and may be comprised of multiple layers. The electronic display 11 may be any type of electronic display 11, including but not limited to, a liquid crystal display (LCD), light emitting diode (LED) display, organic LED (OLED) display, plasma display, or the like. The space between the rear surface of the cover panel 17 and the front surface of the electronic display 11 may define a first channel 25. A display assembly housing 15 may surround the electronic display 11 such that the combination of the cover panel 17 and the display assembly housing 15 substantially encloses the electronic display 11. One or more of the display assemblies 14 may further configured to receive touch input. For example, without limitation, the electronic display 11 may be a capacitive or resistive touch screen, though any type of touch screen is contemplated.

A backlight 21 may be located behind and substantially parallel to the electronic display 11. The backlight 21 may be spaced apart from the electronic display 11, though such is not required. A second channel 23 may be located within the display assembly 14 and may be configured to receive ambient air 38. The second channel 23 may permit ambient air 38 to flow vertically through the display assembly 14. In exemplary embodiments, the second channel 23 is defined, at least in part, by the space between the rear surface of the backlight 21 and the rear surface of the display assembly housing 15, though any location is contemplated.

A first and a second side channel 32 may extend along either side of the display assembly 14. The side channels 32 may be configured to receive circulating gas 36. In exemplary embodiments, the side channels 32 are defined, at least in part, by the space between the second channel 23 and the side of the display assembly housing 15, though any location is contemplated.

One or both sides of the frame 12 may comprise a side gap 13 located between interior and exterior side panels. As such, the assembly 10 may comprise a first and a second side gap 13, where each is located on either side of the frame 12. In other exemplary embodiments, the assembly 10 may comprise only a first side gap 13. Apertures may be located along the interior panels of the side(s) of the frame 12 having the side gap(s) 13 such that circulating gas 36 may be passed from the electronics cavity 12 into and out of the side gap(s) 13. In exemplary embodiments, the circulating gas 36 may flow from the first side gap 13 though the first side channel 32, though the first channel 25, through the second side channel 32, through the second side gap 13, though the electronics cavity 18, and be returned to the first side gap 13, thereby forming a closed loop. In exemplary embodiments where the assembly 10 comprises only the first side gap 13, the circulating gas 36 may pass directly from the electronics cavity 18 into or out of the first or the second side channel 32. Additionally, in exemplary embodiments where two display assemblies 14 are placed back-to-back, the circulating gas 36 may be split and travel through first channel 25 located in each respective display assembly 14. Side gaps 13 are not required.

One or more fans 34 may be mounted to said apertures in the interior panels of the side of the frame 12 to force the circulating gas 36 though the closed loop, though it is contemplated that any number of fans 34 may be placed at any number of locations along the path of the circulating gas 36.

The bottom and top of the frame 12 may similarly comprise interior and exterior panels with an upper gap 41 and a lower gap 40 located therebetween, though such is not required. Apertures may be located along the exterior panels of the bottom and top of the frame 12 such that ambient air 38 may be ingested from outside of the assembly 10 and exhausted from inside of the assembly 10. These apertures may form the exhaust 9 and the intake 16. In exemplary embodiments, ambient air 38 may be ingested from the bottom of the assembly 10 into the lower gap 40. The ambient air 38 may then travel vertically upwards through the second channel 23 in the display assembly 14 and into the upper gap 41. The ambient air 38 may then be exhausted through the intake 16, thus forming an open loop. In the exemplary embodiments where the first and the second display assemblies 14 are placed back-to-back, the ambient air 38 may be split and travel through each of the channels 23 located in each of the respective display assemblies 14.

One or more fans 34 may be mounted to said apertures in the exterior panels of the bottom of the frame 12 to force the ambient air 38 though the open loop, though it is contemplated that any number of fans 34 may be located in any number of locations along the path of the ambient air 38.

The ambient air 38 flowing through the second channel 23 may be in thermal communication with the backlight 21 so as to absorb heat generated therefrom, though such is not required. The ambient air 38 flowing through the second channel 23 may be in thermal communication with circulating gas 36 flowing through the closed loop such that the relatively cool ambient air 38 may remove heat from the relatively warm circulating gas 36. The ambient air 38 flowing through the open loop may be in thermal communication with the circulating gas 32 flowing through the closed loop so as to absorb heat therefrom while not allowing the ambient air 38 and the circulating gas 32 to substantially mix.

Figure 7:
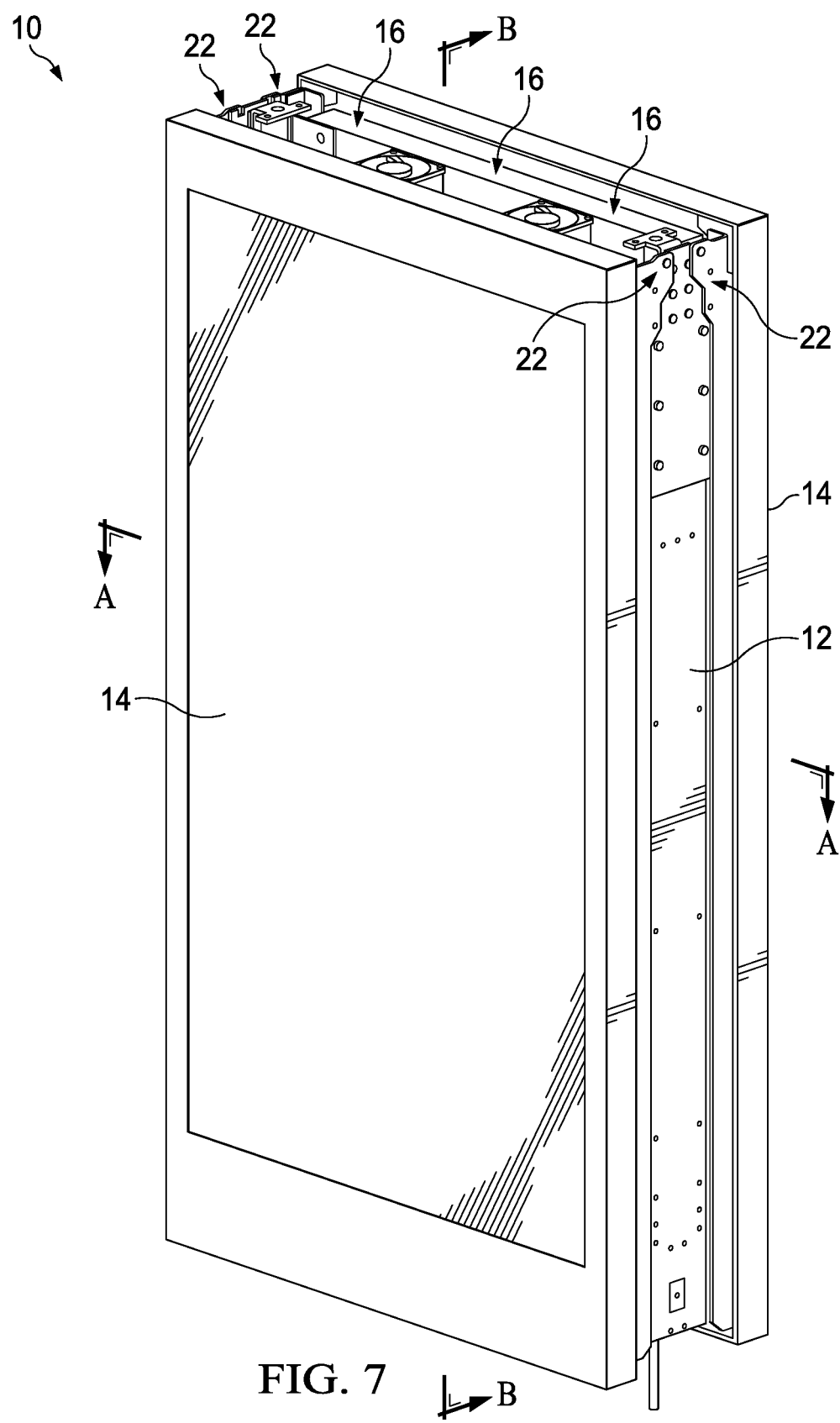
FIG. 7 is a front perspective view of another exemplary embodiment of the assembly also indicating section lines A-A and B-B.

FIG. 7 is a front perspective view similar to FIG. 1 of another exemplary embodiment of the assembly 10 also indicating section lines A-A and B-B.

Figure 8:
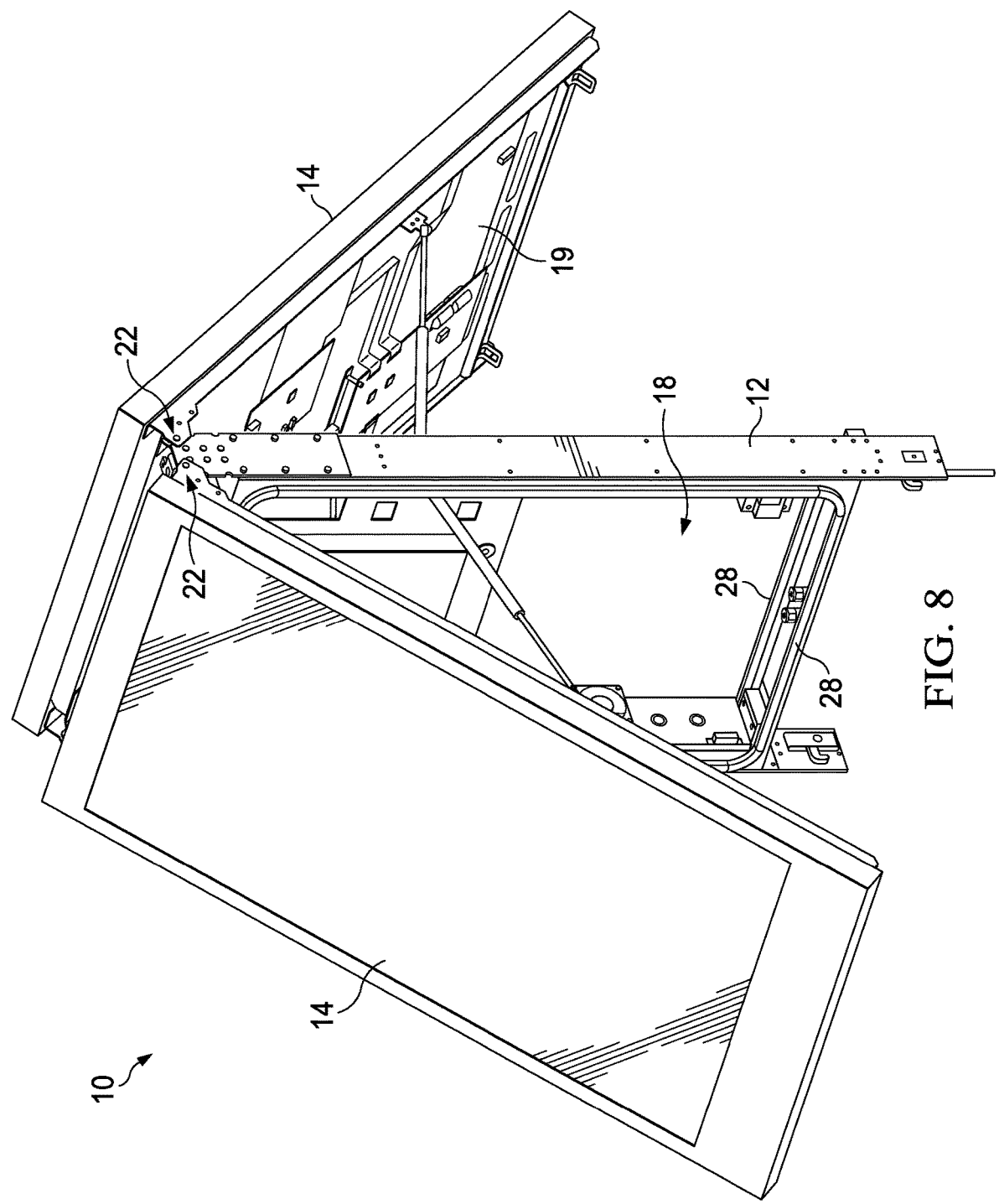
FIG. 8 is a front perspective view of the assembly of FIG. 7 illustrated with both display assemblies in the open position.

FIG. 8 is a front perspective view of the assembly 10 of FIG. 7 illustrated with both display assemblies 14 in the open position. The plate 19 may be mounted to one of the display assemblies 14. In other exemplary embodiments, the plate 19 may form a part of the display assembly 14. Many or all of the electronic components 30 may still be shared by the display assemblies 14.

Figure 9:
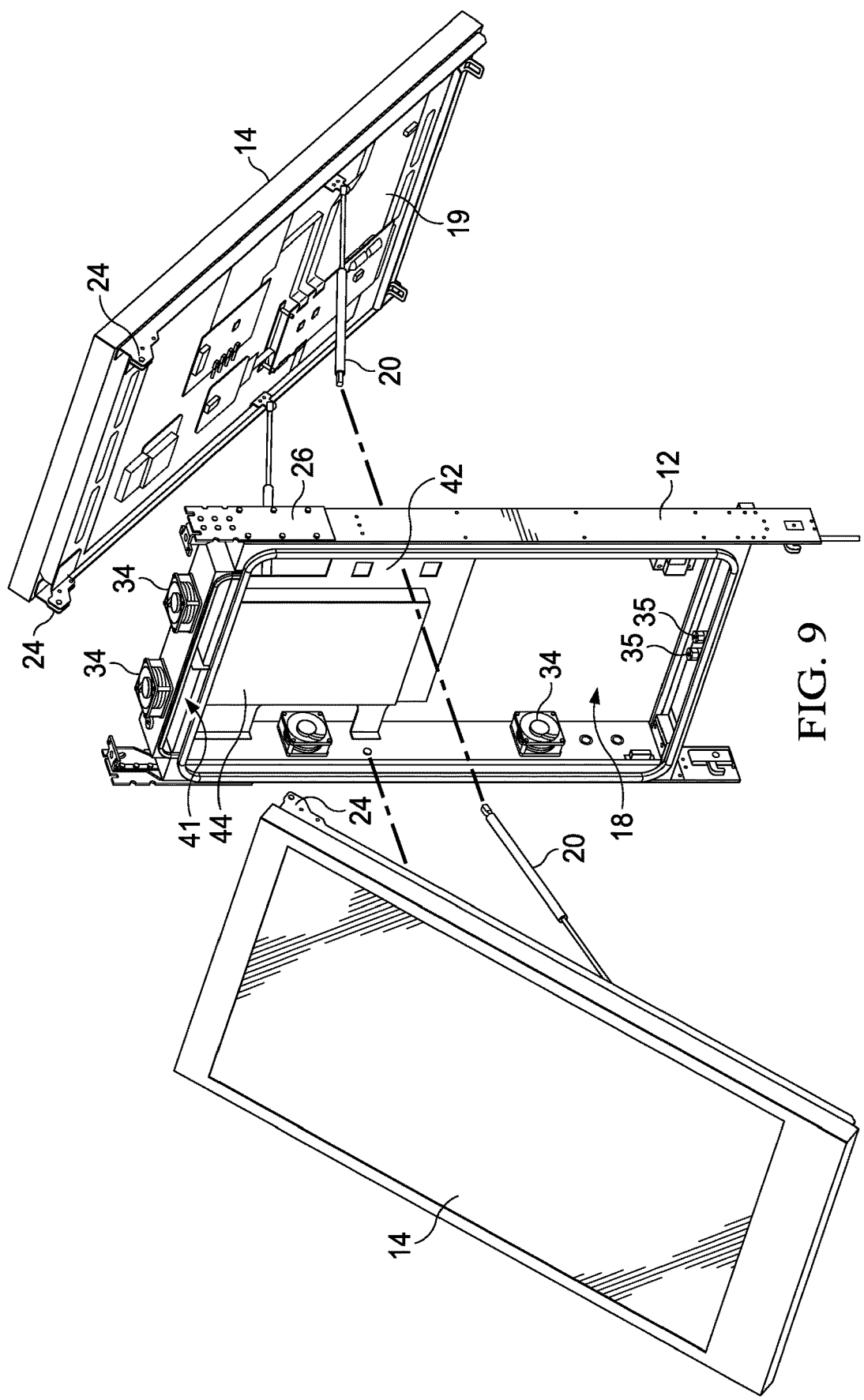
FIG. 9 is an exploded front perspective view of the assembly of FIG. 8.

FIG. 9 is a front perspective exploded view of the assembly of FIG. 8. A second plate 42 may be mounted to the frame 12, though such is not required. The second plate 42 may be located an upper portion of the electronics cavity 18, though any location is contemplated. The second plate 42 may be mounted to extend parallel to the front surface of the electronic display assemblies 14 when the electronic display assemblies 14 are in the closed position. The second plate 42 may be configured to receive additional electronic components 44, which may be mounted thereto. In exemplary embodiments, the additional electronic components 44 may comprise customer-specific or customer-installed electronic components or components to operate the assembly 10. However, any type of electronic components 44 are contemplated, such as but not limited to, computers, processors, routers, servers, machine to machine communications equipment, wireless connectivity devices, Bluetooth connectivity devices, near field communication devices, cameras, electronic storage devices, memory, and the like. In exemplary embodiments, the second plate 42 may be a server rack, such as but not limited to, a 1 U server rack.

By placing the display assemblies 14 in the opened position, the elections cavity 18, the plate 19, the second plate 42, the related electronic components 30 and additional electronic components 44 may be maintained, repaired, replaced, or otherwise serviced. Additionally, the display assemblies 14 themselves may by maintained, repaired, replaced, or otherwise serviced by removing the display assemblies from the hinging device 22 as previously discussed.

Various pass through devices 35 may be located in the walls defining the cavity 18 such that power lines, communication lines, and the like may be passed into the cavity 18 from outside. The pass-through devices 35 may be configured to provide a substantially air and water tight seal. Any number and location of said pass through devices 35 are contemplated. This may help to reduce the number of pass through points in the assembly 10 and simplify the cabling. The cavity 18 may provide a substantially sealed, cooled, connected, and/or powered electronics cavity 18 for mounting electronic components, such as but not limited to, the additional electronic components 44 and the electronic components 30.

FIG. 9 illustrates an exemplary assembly 10 where the fans 24 for the ambient air 38 may be located on the top of the frame 12 in the apertures of the upper gap 41.

Figure 10:
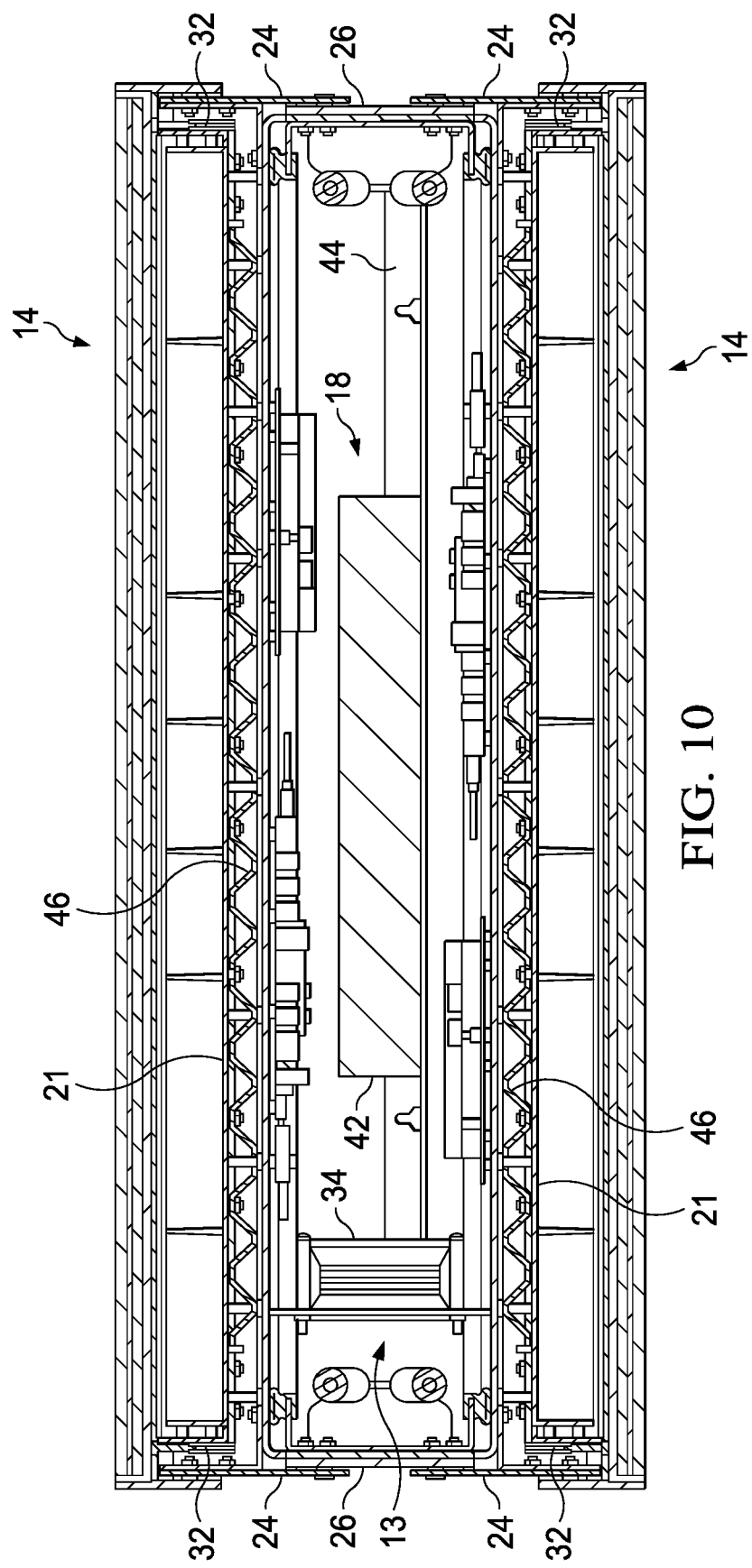
FIG. 10 is a top sectional view taken along section line A-A of FIG. 7.

FIG. 10 is a top sectional view taken along section line A-A of FIG. 7 and illustrating the display assemblies 14 in the closed position. The second channel 23 may comprise a corrugation layer 46 located between the backlight 21 and the electronics cavity 18. The ambient air 38 may pass through the corrugation layer 46. As illustrated in FIG. 10, the assembly 10 may only comprise the first side gap 13. It is contemplated that the first side gap 13 may be located on either side of the assembly 10 or may not be required at all.

Figure 11:
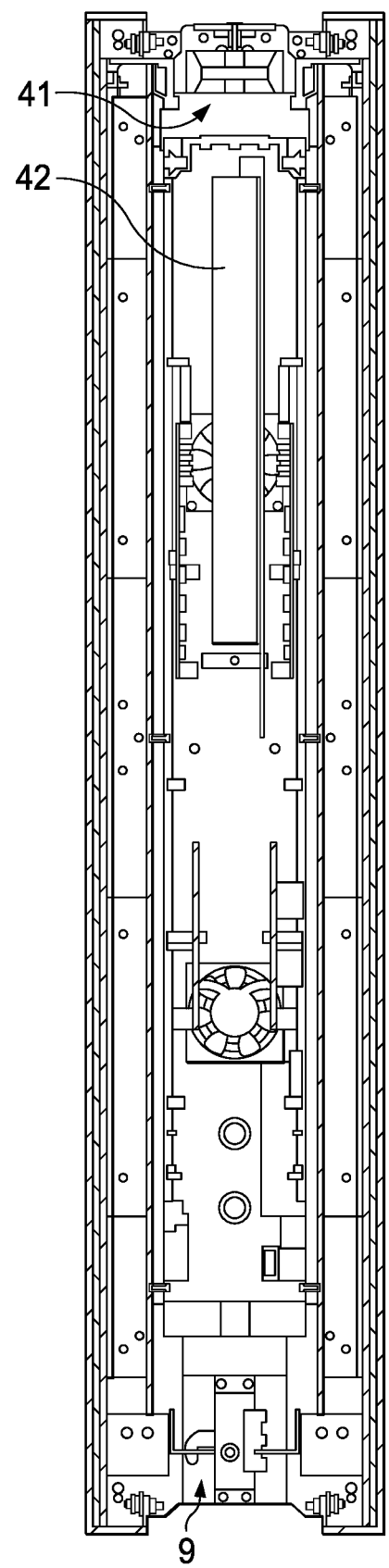
FIG. 11 is a side sectional view taken along section line B-B of FIG. 7.

FIG. 11 is a side sectional view taken along section line B-B of FIG. 7. As illustrated in FIG. 11, the lower gap 40 is optional. Instead, ambient air 38 may enter via the exhaust 9 and be ingested directly into the display assemblies 14 where it may travel through the second channel 23 to the upper gap 41 and exit via the intake 16.

Figure 12B:
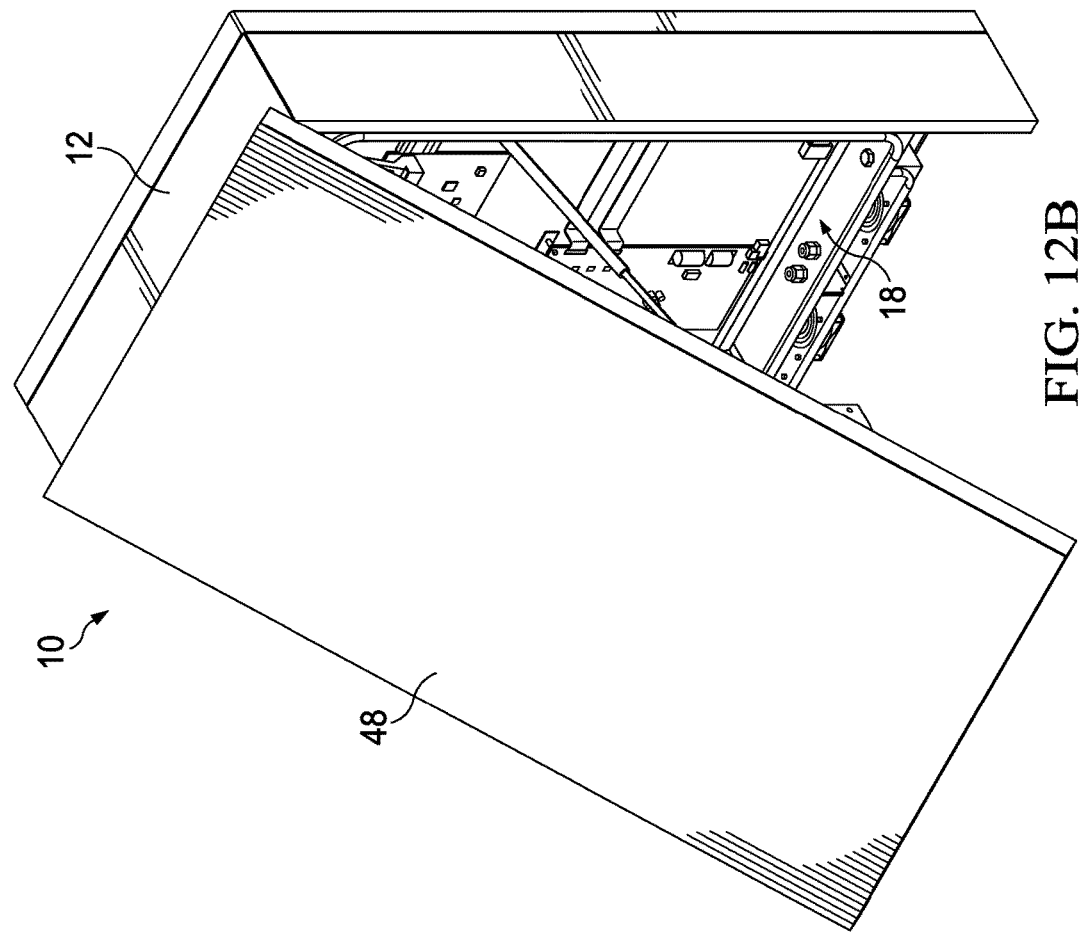
FIG. 12B is a rear perspective view of another exemplary assembly.
Figure 12A:
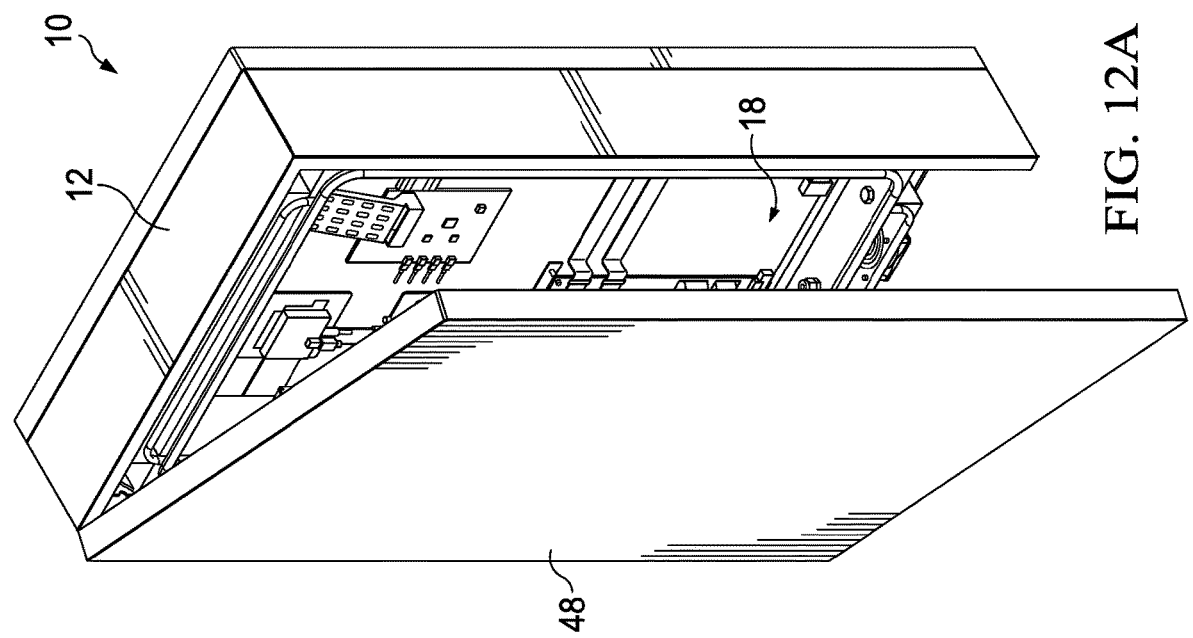
FIG. 12A is a rear perspective view of another exemplary assembly.

FIG. 12A and FIG. 12B is a rear perspective view of another exemplary assembly 10. FIGS. 12A-12B illustrates an exemplary assembly 10 having a single display assembly 14 and further comprising the access panel 48 located on the rear of the frame 12. The access panel 48 may be a door, though any type of access panel 48 is contemplated. The access panel 48 may be comprised of sheet metal, though any material is contemplated. In other exemplary embodiments, the access panel 48 may be configured to hold a static poster. For example, without limitation, the access panel 48 may comprise a transparent cover located above the door to define a poster cavity configured hold the poster such that it may be located therebetween. In yet another example, without limitation, edge lighting may be placed at various locations around said poster to illuminate the poster.

In exemplary embodiments the access panel 48 may swing open horizontally (as shown in FIG. 12A) or vertically (as shown in FIG. 12B). In exemplary embodiments where the access panel 48 swings open vertically, aid devices 20 may likewise be used to assist in moving the access panel 48 between the open and closed positions as well as securing the access panel 48 in the open and closed positions. The access panel 48 may be lockable to the frame 12 or the housing 6 such that the access panel 48 cannot normally be moved from the closed position unless unlocked. This may assist in restricting access to the electronics cavity 18 to authorized personnel.

In exemplary embodiments, the plate 19 may be mounted to the access panel 48. In still other exemplary embodiments, the access panel 48 may be the plate 19.

Although the flow of the ambient air 38 and the circulating gas 36 may be shown and described herein with respect to particular directions and orientations, it is contemplated that the ambient air 38 and the circulating gas 36 may flow in other directions. For example, without limitation, ambient air 38 and circulating gas 36 shown as flowing clockwise may flow counter-clockwise, when shown flowing vertically from top to bottom may flow from bottom to top, when shown flowing horizontally from right to left may flow from left to right, when shown flowing vertically may flow horizontally, when shown flowing horizontally may flow vertically, and the like.

It is contemplated that the assembly 10, or various components thereof, may be adapted for and/or used with any size display assemblies 14 in any application. For example, but not to serve as a limitation, the assembly 10, or various components thereof, may be adapted for and/or used with a vehicle topper unit such as is illustrated and described in U.S. patent application Ser. No. 15/450,365 filed Mar. 6, 2017, the disclosures of which are hereby incorporated by reference in their entirety.

Figure 13:
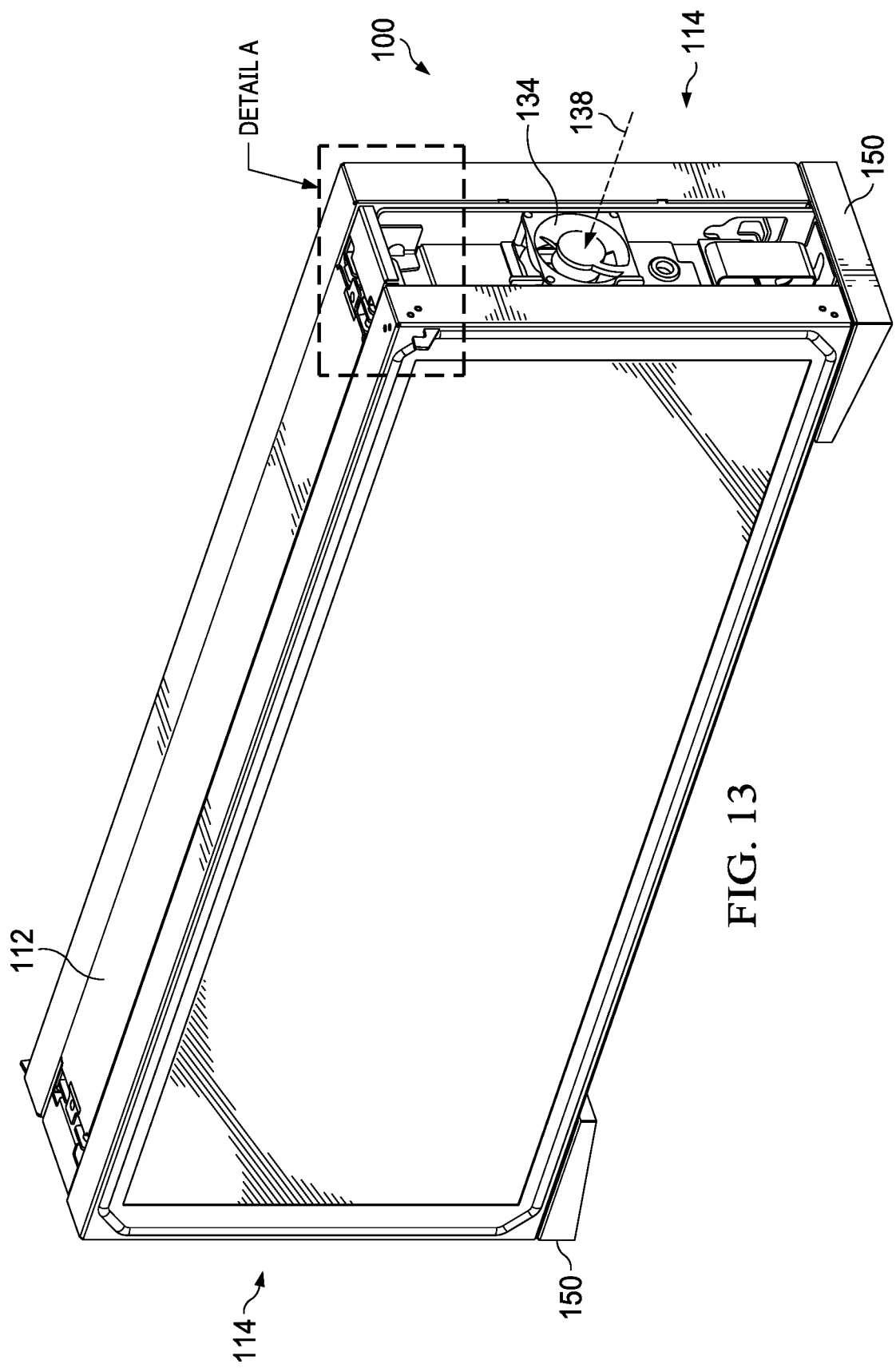
FIG. 13 is a front perspective view of another exemplary assembly also indicating Detail A.

FIG. 13 is a front perspective view of another exemplary assembly 100 also indicating Detail A. FIG. 13 through FIG. 18B illustrate and describe an adaptation of the assembly 10 for use with a vehicle topper unit as previously mentioned. Similar features have been similarly numbered but increased by 100 (e.g., assembly 10 and assembly 100). The assembly 100 may comprise a frame 112 which may be rectangular in shape, though any shape is contemplated. The frame 112 may be covered by cladding that forms a housing. The cladding may provide an aesthetically pleasing appearance and may improve aerodynamics. The frame 112 may be adapted to be mounted to the roof of a vehicle, though such is not required. A first and second display assembly 114 may be attached to the frame 112, though any number of display assemblies 114 are contemplated. In exemplary embodiments, the first and second display assemblies 114 are placed back-to-back on either side of the frame 112. The assembly 100 may further comprise a pair of mounting devices 150. In exemplary embodiments, the mounting devices 150 may be located on the underside of the frame 112 and may be feet configured to permit the assembly 100 to be mounted to the roof of a vehicle, though any type of mounting device 150 is contemplated.

A fan 134 may be located on an aperture in the frame 112 to permit the ingestion of ambient air 138. Once ingested, the ambient air 138 may travel horizontally through channels in the display assemblies 114 and exit through apertures on the other end of the frame 112. This may form an open loop. It is contemplated that the fan 134 may be located at any location along the path of the ambient air 138.

Figure 14:
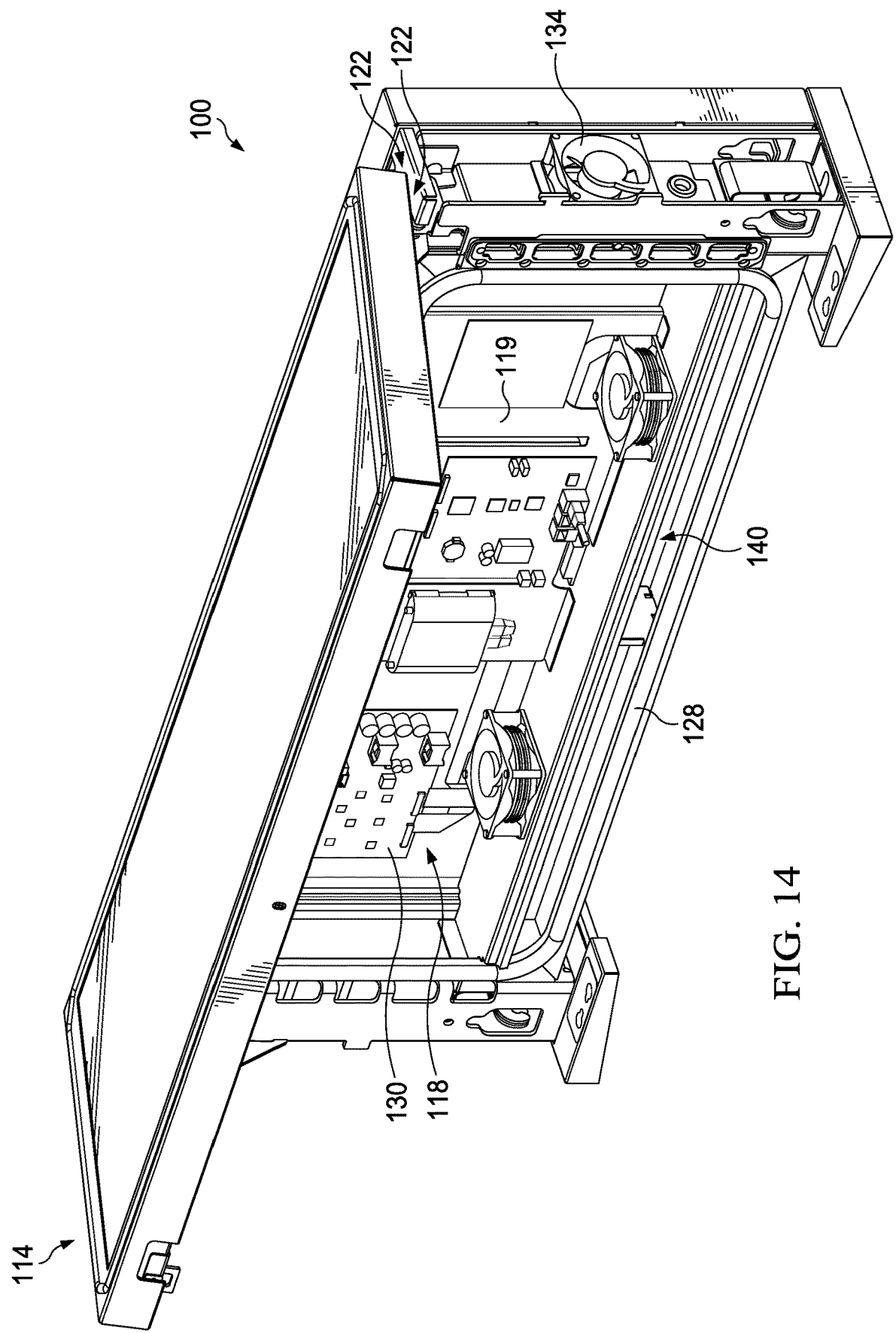
FIG. 14 is a front perspective view of the assembly of FIG. 13 illustrated with one of the display assemblies in the open position.

FIG. 14 is a front perspective view of the assembly 100 of FIG. 13 illustrated with one of the display assemblies 114 in the open position. The display assemblies 114 may be hingedly mounted to the frame 112 by way of a hinging device 122. The hinging device 122 may permit the display assemblies 114 to be moved between a closed position, wherein the respective display assembly 114 rests against the frame 112 and/or where the front surface of the respective display assembly 114 is substantially perpendicular to the ground, and an open position wherein the respective display assembly 114 is rotated outwardly from the frame 112 and/or where the front surface of the respective display assembly 114 is substantially parallel to the ground. A gasket 128 may extend around the perimeter of the surfaces of the frame 112 which contact the display assemblies 114. The gaskets 128 may provide a substantially air tight seal in the electronics cavity 118 when the display assemblies 114 are located in the closed position.

An electronics cavity 118 may be located between the rear surfaces of the display assemblies 114. The electronics cavity 118 may comprise a plate 119 that is configured to receive a number of electronic components 130 or additional electronic components 144 which may be mounted thereto. In exemplary embodiments, the plate 119 may be mounted to the frame 112. In other exemplary embodiments, the plate 119 may be mounted to, or form a part of, one of the display assemblies 114. Various pass through devices 135 may be located in the walls defining the cavity 118 such that power lines, communication lines, and the like may be passed into the cavity 118 from outside. The pass-through devices 135 may be configured to provide a substantially air and water tight seal. This may help to reduce the number of pass through points in the assembly 100 and simplify the cabling. In exemplary embodiments, the electronics cavity 118 may provide a cooled, powered, connected, and/or sealed area for electronic components, such as but not limited to, the electronic components 130 and the additional electronic components 144.

When either or both the of display assemblies 114 are placed in the open position, the electronics cavity 118 may be exposed. This may allow access to the electronics cavity 118, the plate 119, and the electronic components 130 such that personnel may inspect, maintain, repair, replace, or otherwise service the electronic components 130 located therein. In exemplary embodiments, the display assemblies 114 may be selectively locked to the frame 112 such that the respective display assembly 114 cannot normally be moved from the closed position unless unlocked. This may assist in restricting access to the electronics cavity 118 to authorized personnel.

The frame 112 may comprise interior and exterior surfaces. In exemplary embodiments, a lower gap 140 may be located in the space between the interior and exterior surfaces of the frame 112 along a lower portion thereof. Stated another way, the lower gap 140 may be located between the bottom of the electronics cavity 118 and the bottom of the frame 112.

Figure 15:
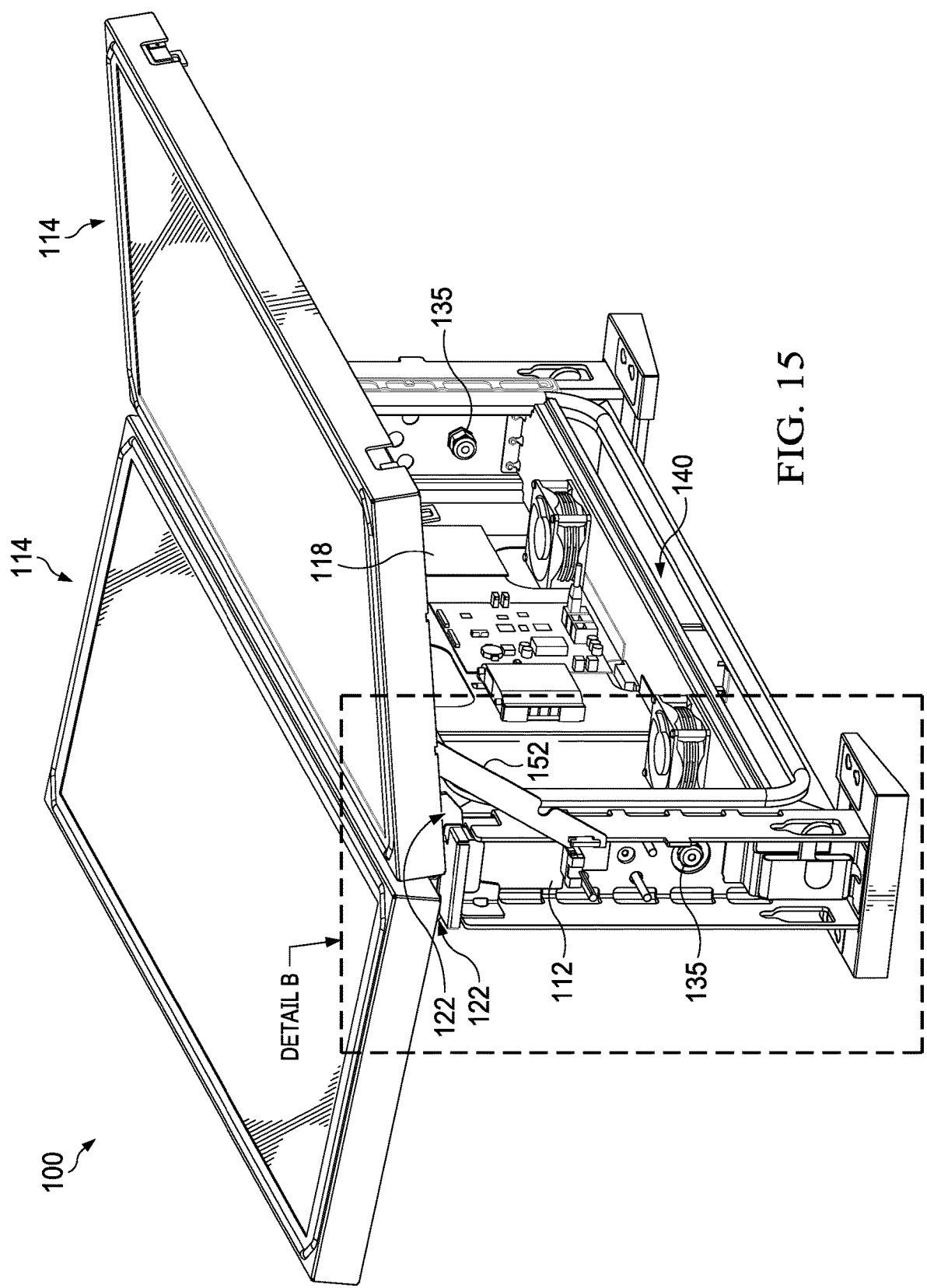
FIG. 15 is a rear perspective view of the assembly of FIG. 13 illustrated with both of the display assemblies in the open position also indicating Detail B.

FIG. 15 is a rear perspective view of the assembly 100 of FIG. 13 illustrated with both of the display assemblies 114 in the open position and also indicating Detail B. A first and second strut 152 may extend between the frame 112 and each of the respective display assemblies 114. In other exemplary embodiments, a pair of struts 152 may be used for each respective display assembly 114. The strut 152 may be configured to temporarily secure the respective display assembly 114 in the opened position, although it is contemplated that the strut 152 may be configured to also temporarily secure the respective display assembly 114 in the closed position. Alternatively, any of the aid devices 20 may be utilized in conjunction with or in substitution of the struts 152.

In exemplary embodiments, the struts 152 may be mounted to each of the respective display assemblies 114 in a rotatable fashion. The strut 152 may be mounted in a rotatable fashion by way of a pin or a fastener, though any device or mounting configuration is contemplated. Regardless, the struts 152 may be configured to be temporarily secured to each of the respective display assemblies 114 such that the respective display assembly 114 is propped or otherwise held in the open position. While the struts 152 are discussed as being mounted to each of the respective display assemblies 114 and temporarily secured to the frame 112, it is contemplated that the struts 152 may instead be mounted to frame 112 and temporarily secured to each of the respective display assemblies 114.

Figure 16:
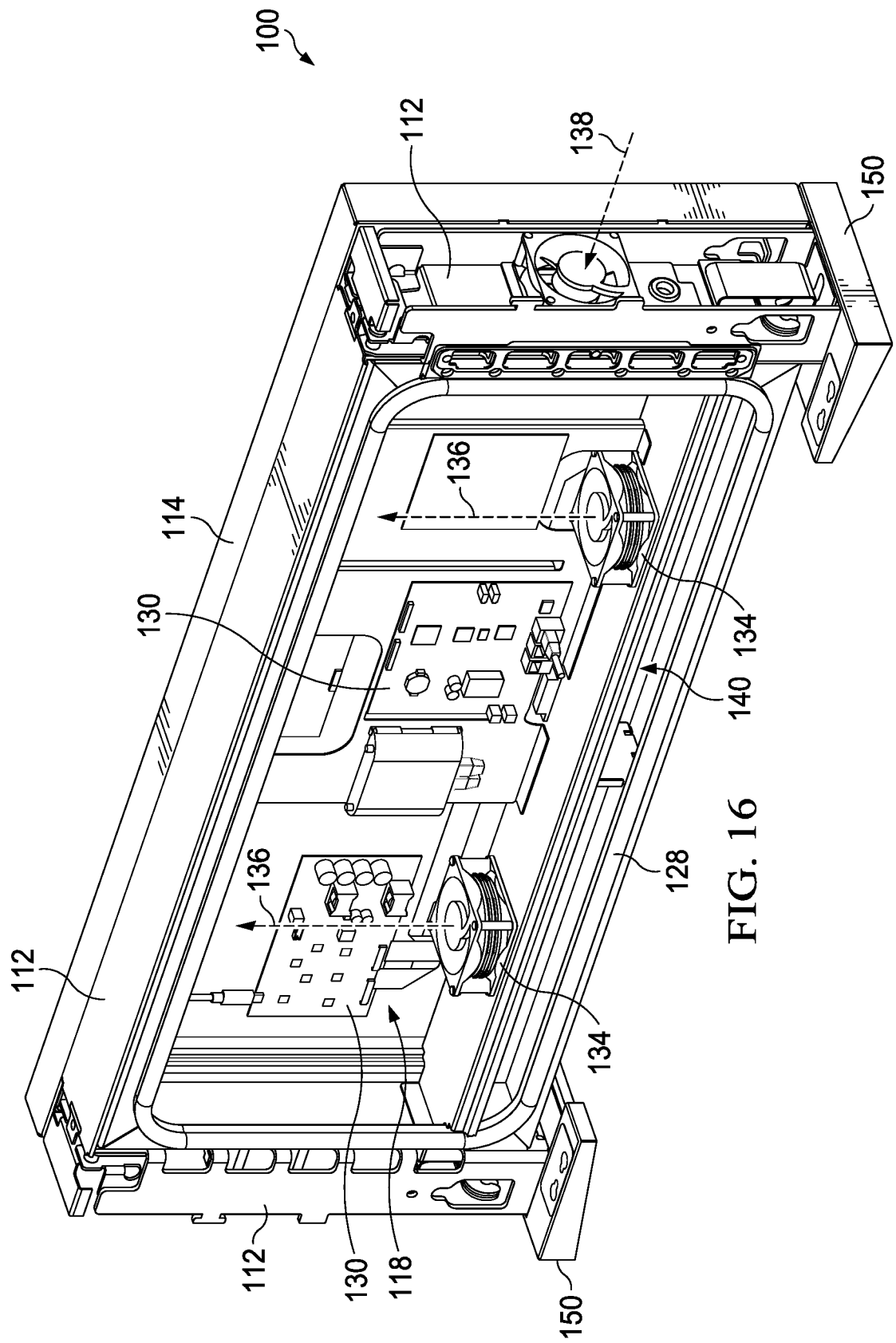
FIG. 16 is a front perspective view of the assembly of FIG. 14 illustrated with one of the display assemblies removed.

FIG. 16 is a front perspective view of the assembly 100 of FIG. 14 illustrated with one of the display assemblies 114 removed. Circulating gas 136 may travel vertically through the electronics cavity 118 where it is separated and passes through each respective display assembly 114. In exemplary embodiments, the circulating gas 136 flows through a channel between a cover glass an electronic display in each of the respective display assemblies 114. The circulating gas 136 may then travel through the lower gap 140 and be returned to the electronics cavity 118 via apertures in the interior surfaces of the frame 112, thereby forming a closed loop. In exemplary embodiments, these apertures in the frame 112 may have fans 134 mounted thereto to move the circulating gas 136 through the closed loop, though it is contemplated that the fans 134 may be located anywhere along the path of the circulating gas 136.

U.S. patent application Ser. No. 15/450,365 filed Mar. 6, 2017, the disclosures of which are hereby incorporated by reference in their entirety, describes an exemplary thermal management system for the assembly 100 including, but not limited to, open and closed loop pathways for ambient air and circulating gas.

Figure 17:
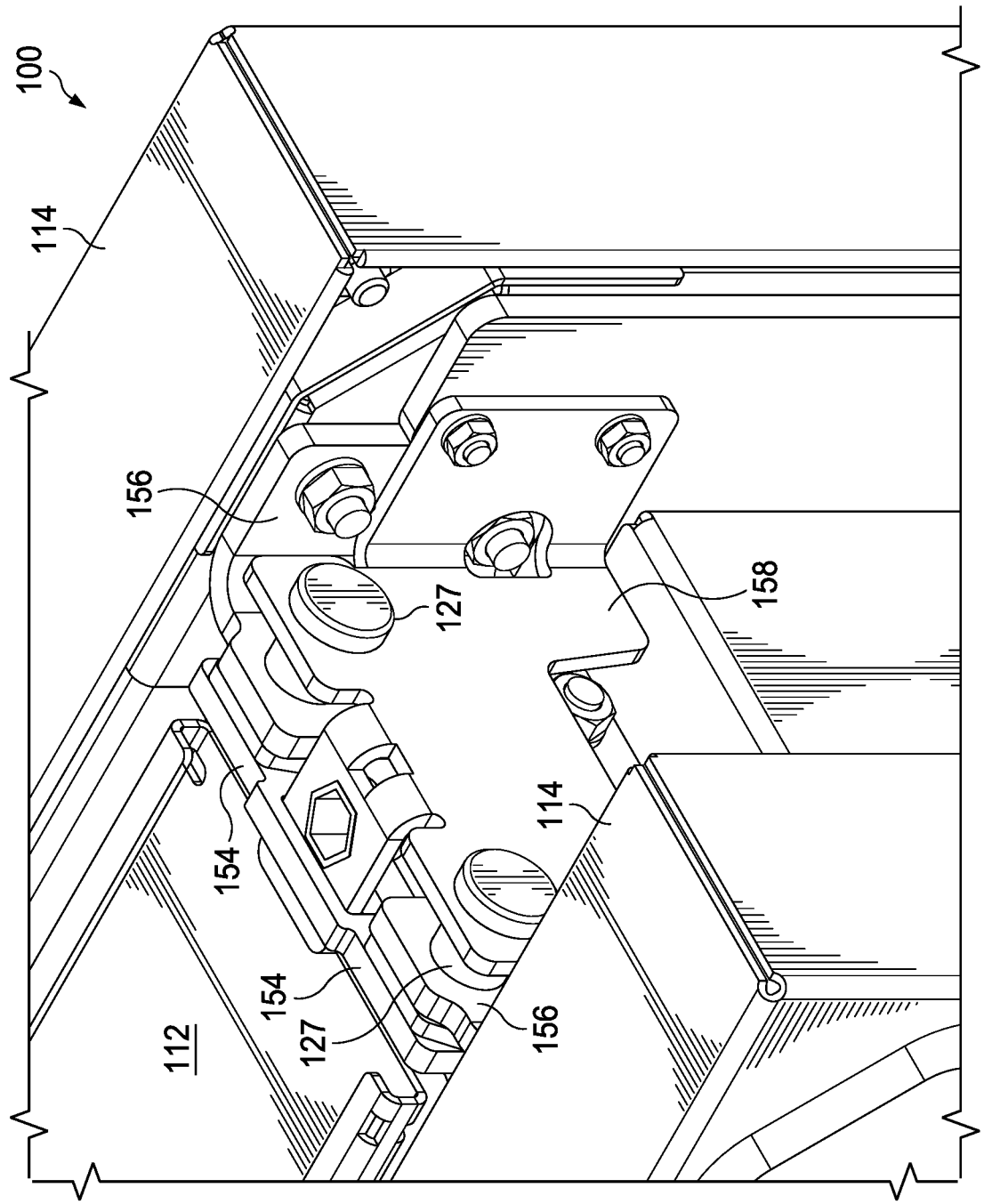
FIG. 17 is a detailed top perspective view of Detail A of FIG. 13.

FIG. 17 is a detailed top perspective view of Detail A of FIG. 13. The hinging device 122 may comprise a first and second display hinge plate 156, a first frame hinge plate 154, and a second frame hinge plate 158. Each of the first and second display leaves 156 may be substantially "L" shaped and may be configured to extend between a rear surface of the respective display assemblies 114 and the first frame hinge plate 154. The first frame hinge plate 154 may be mounted to either end of the frame 112. Optionally, a second frame hinge plate 158 may be located on the other side of the first and second display leaves 156 such that the first and second display leaves 156 are sandwiched between the first frame hinge plate 154 and the second frame hinge plate 158. A first fastener 127 may extend through the first frame hinge plate 154, the first display hinge plate 156, and the second frame hinge plate 158. Likewise, a second fastener 127 may extend through the first frame hinge plate 154, the second display hinge plate 156, and the second frame hinge plate 158. The fastener 127 may be a pin or another device allowing for rotational movement of the first and second display leaves 156. In exemplary embodiments, the second frame hinge plate 158 may be selectively secured to the respective display assembly 114 such that the respective display assembly 114 may be temporarily secured in the closed position.

The design of the hinge device 122 may provide for easy removal of one or both of the display assemblies 114 when performing inspections, maintenance, repairs, replacements, or otherwise servicing the assembly 100. The fasteners 127 may simply be removed from either side of the respectively display assembly 114 and the entire display assembly 114 may be removed. A replacement display assembly 114 may then be installed. The display assembly 114 being inspected, maintained, repaired, replaced, or otherwise serviced may then be returned to a service center for servicing. This may minimize downtime of the assembly 100.

FIG. 18A is a detailed perspective view of Detail B of FIG. 15 also illustrating the otherwise hidden strut 152. FIG. 18B is a top perspective view of the assembly 100 of FIG. 18A illustrated with the display assembly 114 in the open position. As can be seen, the strut 152 may be moved between a supporting and a stored position. The strut 152 may rotated into the stored position such that the strut 152 is aligned with the display assembly 114 when the display assembly 114 in the closed position. In this way, the strut 152 may be stored within the respective display assembly 114 when the strut 152 is not being used to keep the display assembly 114 in the open position. The strut 152 may be rotated into the supporting position where the strut 152 is secured at an angle to the frame 112 such that the display assembly 114 is propped or otherwise held in the open position. In exemplary embodiments, the strut 152 may comprise a notch 153 configured to be temporarily secured to a corresponding bracket or groove located on the frame 112 so as to prop or hold the respective display assembly 114 in the open position.

Figure 19:
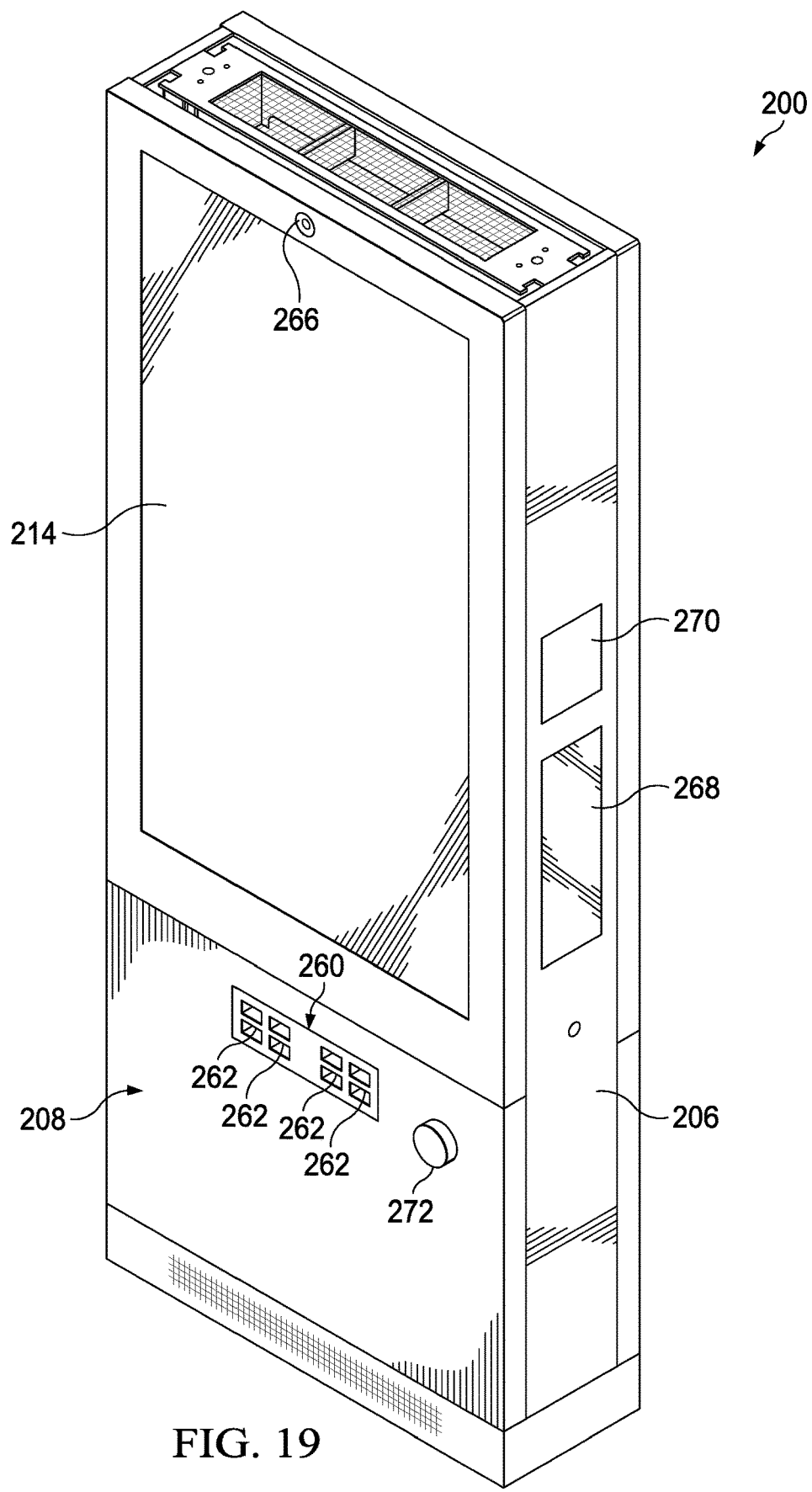
FIG. 19 is a front perspective view of an exemplary assembly having multiple exemplary peripheral devices.

FIG. 19 is a front perspective view of an exemplary assembly 200 in accordance with the present invention. It is noted that the assembly 200 may be similar to the assembly 10 illustrated in FIG. 1 and like items have been numbered similarly but increased by 100 (e.g., 14 to 214). The assembly 200 may comprise a housing 206 which surrounds a display assembly 214. The housing 206 may comprise a stand 208 for mounting the assembly 200 to the ground. However, in other exemplary embodiments, the assembly 200 may be mounted to another object such as, but not limited to, a bus shelter, a post, a wall, a building, or the like.

The assembly 200 may comprise a number of peripheral devices. Peripheral devices may include, but are not limited to, a charging subassembly 260, a camera 266, a touchscreen or additional electronic displays 268, video or audio communications equipment 270, emergency notification subassembly 272, and the like. In exemplary embodiments, the peripheral devices may vary and may be equipment specifically desired or otherwise requested by a customer. The peripheral devices themselves, or the supporting electronic components therefore, may be placed within the sealed, powered, and temperature regulated cavity 218. Such placement may provide acceptable operating conditions and may limit or eliminate exposure to contaminates and/or undesirable environmental conditions.

The camera 266 may be any kind of camera. In exemplary embodiments the camera 266 is coupled with electronic components 230 and software which are configured to detect the presence of individuals in close proximity to the assembly 200 as well as the characteristics of such individuals. For example, but without limitation, the camber 266 may be configured to detect the number of individuals, age (or age range), their expression, mood, body language, identity (via facial recognition or the like), and/or gender. The camera 266, electronic components 230, and software may be further configured to track the number of individuals viewing the display assembly 214, the dwell time of said individuals, and the amount and approximate location of eye contact with the display assembly 214.

The video or audio communications equipment 270 may include, but is not limited to, a camera, an electronic display, a microphone, a speaker, video conferencing equipment, audio conferencing equipment, and the like.

The emergency notification subassembly 272 may include a button or other device and may be configured to automatically provide connectivity with or notification to emergency services, such as but not limited to, 911, local police, security, fire, hospital, emergency responders, or the like.

The touchscreen or additional screen 268 may be located anywhere on the assembly 200. In other exemplary embodiments, multiple touchscreens or additional screens 268 may be used.

Figure 20A:
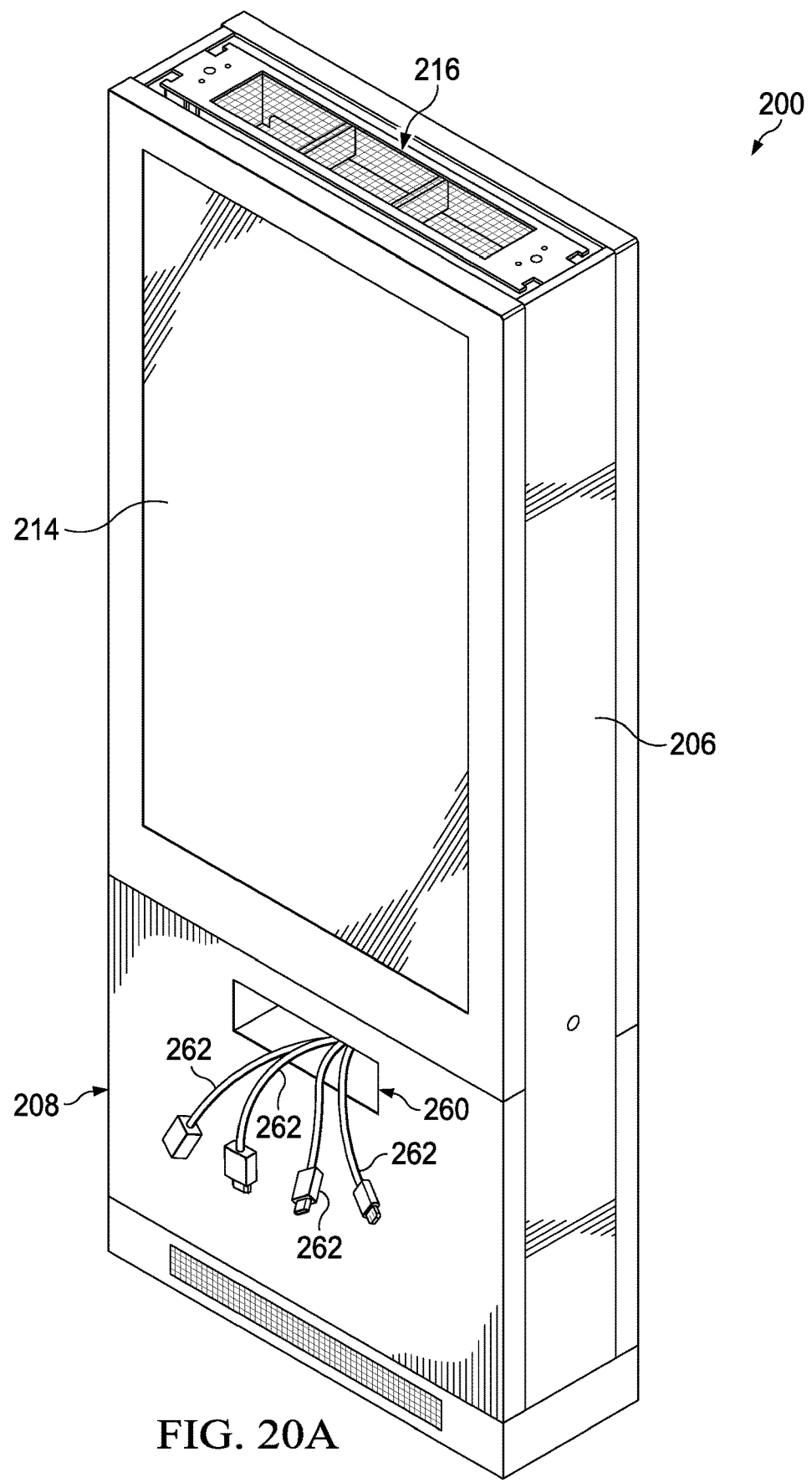
FIG. 20A is a front perspective view of an exemplary assembly having an exemplary charging subassembly in accordance with the present invention.

FIG. 20A is a front perspective view of an exemplary assembly 200 having an exemplary charging subassembly 260. The charging subassembly 260 may be located on the stand 208 or on any other part of the housing 206. The charging subassembly 260 may be configured to provide access to a number of charging adapters 262. The charging subassembly 260 and charging adapters 262 may be substantially flush with the housing 206 or may be recessed therein or extended therefrom. Regardless, the charging adapters 262 may comprise a number of adapters for charging personal electronic devices such as, but not limited to, smartphones, tablets, pagers, smartwatches, fitness tracking devices, PDAs, laptop computers, e-readers, and the like. The charging adapters 262 may include, but are not limited to, USB, lighting, ethernet, HDMI, 30 pin, 3.5 mm, 2.5 mm, PSP, 8 pin, all variations thereof (for example, but not limited to, USB A, B, C, micro, mini, 2.0, and the like. Also including, but not limited to, male and female versions of the same), and the like. Any type of charging adapter 262 for any type of personal electronic device is contemplated.

It is notable that the charging subassembly 260 may be located anywhere on the housing 206 or there may be multiple charging subassemblies 260 placed on the housing 206. The charging adapters 262 may comprise a number of female adapters configured to accept male charger cords. In other exemplary embodiments, the charging adapters 262 may comprise a number of male adapters configured to plug directly into said personal electronic devices. In still other exemplary embodiments, the charging adapters 262 may comprise a combination of male and female adapters. The charging adapters 262 may be located in the charging subassembly 260 or may extend from wire(s) mounted thereto. The use of wires for the charging adapters 262 may permit flexibility in the location of the personal electronic devices being charged. In exemplary embodiments, the wires are relatively short, approximately 1 foot in length or less. However, any length wire is contemplated. Additionally, the various wires may be of varying lengths.

Figure 20B:
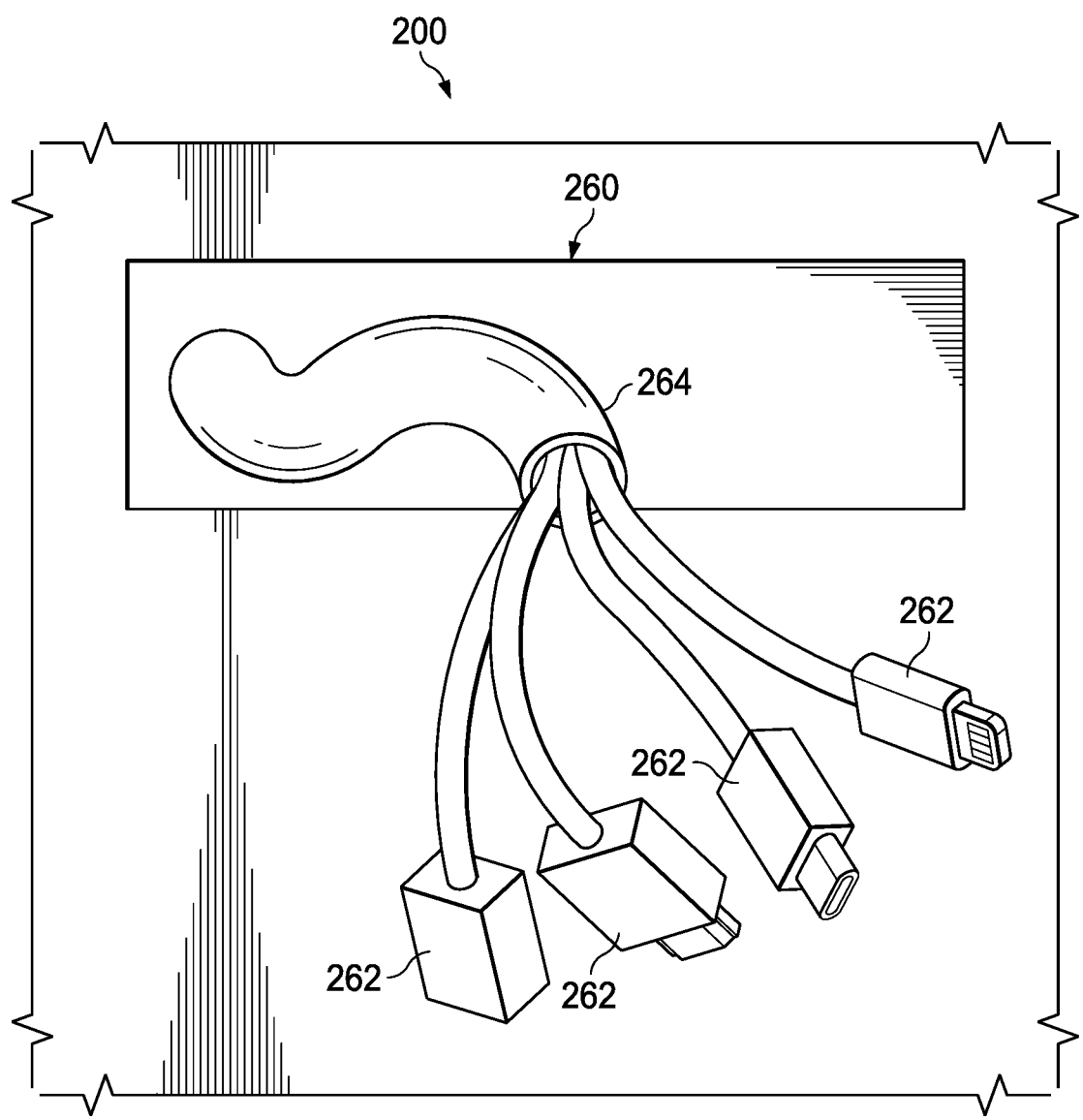
FIG. 20B is a detailed front view of an exemplary charging subassembly in accordance with the present invention.

FIG. 20B is a detailed front view of an exemplary charging subassembly 260 in accordance with the present invention. The charging subassembly 260 may comprise a common cord or wire 264 extending therefrom in electrical connection with a number of charging adapters 262. However, it is contemplated that multiple wires 264 may be used.

Figure 21:
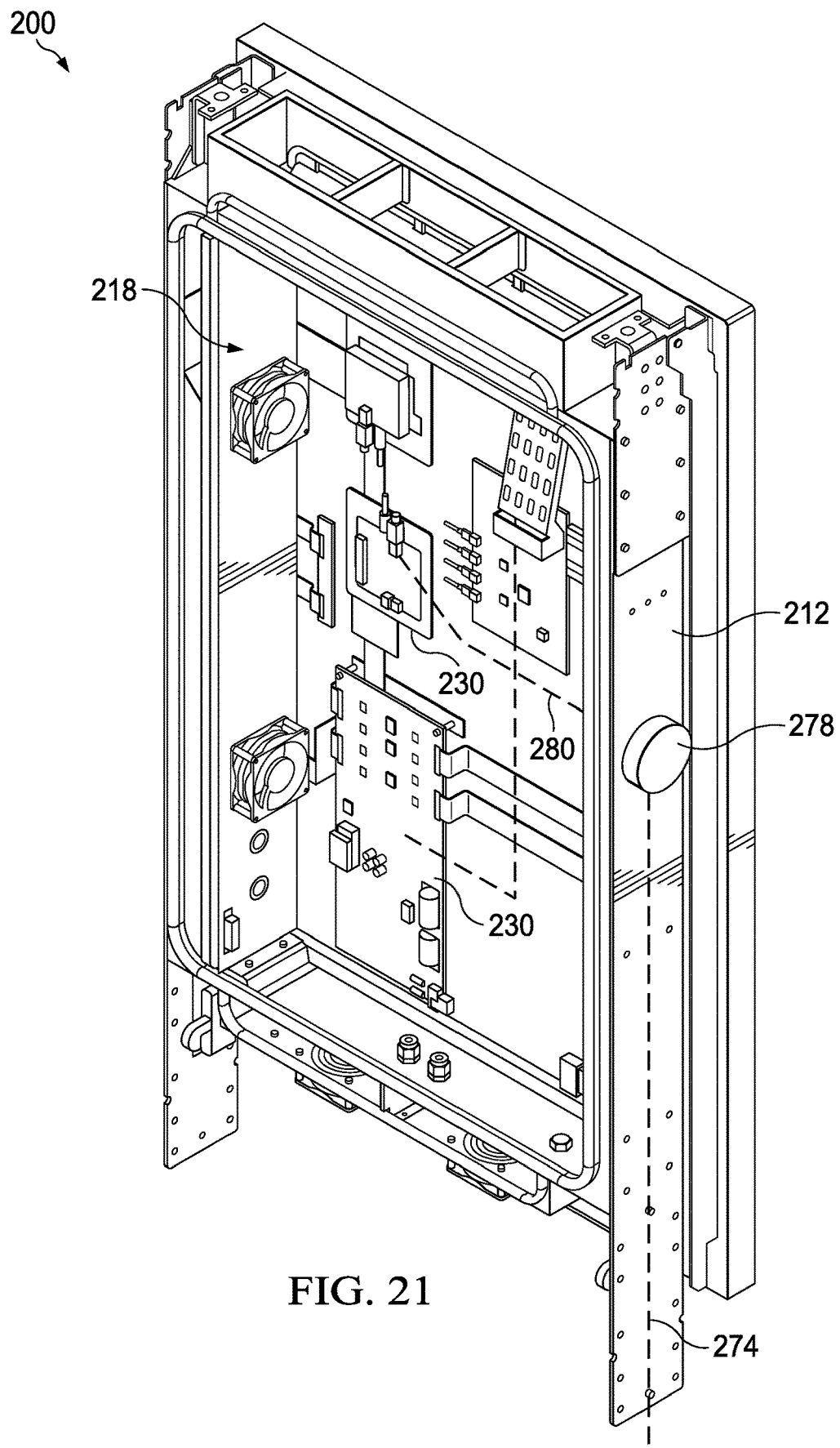
FIG. 21 is a front perspective view of the portion of the assembly illustrated in FIGS. 19-20B with one of the display assemblies removed.

FIG. 21 is a front perspective view of the portion of the assembly 200 illustrated in FIGS. 19-20B with one of the display assemblies 214 removed. A wire harness 274 may comprise a number of wires placed in electrical connection with a power source and/or a communications network. Any type of wire harness 274 is contemplated. In exemplary embodiments, a common power source is used to power the display assemblies 214 as well as the peripheral devices. Likewise, in exemplary embodiments, a common communications network is used to provide connectivity with the display assemblies 214 as well as the peripheral devices. The wire harness 274 may extend along the frame 212 beneath the housing 206 such that the wire harness 274 is not visible from outside of the assembly 200. A pass-through device 278 may be located on the frame 212 or other portion of the assembly 200. The pass-through device 278 may be configured to place the wires of the wire harness 274 in electrical connection with wiring 280 located inside the cavity 218. Any kind of pass-through device 278 is contemplated including, but not limited to, an outlet, port, sealed passage, or the like. In exemplary embodiments, the pass-through device 278 provides a substantially air tight seal, such that the cavity 218 remains substantially air tight. This may prevent contaminants from entering the cavity 218 as well as maintain temperature regulation of the cavity 218. The wiring 280 may place the peripheral devices, as well as the display assembly 214, in electrical connection with the power source and/or communications network via the wires in the wiring harness 274.

The wiring harness 274 may also provide for tidy organization of the wires to maintain ease of identification. The wiring harness 274 may also provide a common disconnection/reconnection point. For example, such the wiring harness 274 may be disconnected, for example but without limitation at the pass-through device 278, to facilitate servicing of the assembly 200. For instance, without limitation, the wiring harness 274 may be disconnected to remove a faulty display assembly 214 and be reconnected upon replacement of a new display assembly 214.

Any embodiment of the present invention may include any of the optional or preferred features of the other embodiments of the present invention. The exemplary embodiments herein disclosed are not intended to be exhaustive or to unnecessarily limit the scope of the invention. The exemplary embodiments were chosen and described in order to explain the principles of the present invention so that others skilled in the art may practice the invention. Having shown and described exemplary embodiments of the present invention, those skilled in the art will realize that many variations and modifications may be made to the described invention. Many of those variations and modifications will provide the same result and fall within the spirit of the claimed invention. It is the intention, therefore, to limit the invention only as indicated by the scope of the claims.

What is claimed is:

1. An electronic display assembly comprising:
a housing;
a frame having a front perimeter and a rear perimeter, wherein said frame is configured to receive the housing;
a first and second gasket located along the front perimeter and the rear perimeter, respectively, of said frame;
a pass-through device located in said housing and configured to accept one or more utility lines;
a first and second electronic display subassemblies mounted to said frame in a back to back arrangement, wherein each of said first and second electronic display subassemblies comprises:
a transparent layer;
an electronic display layer;
a hinging device configured to permit the electronic display subassembly to rotate between an opened position and a closed position; and
a gap defined by the space between the transparent layer and the electronic display layer;
a substantially sealed closed loop pathway surrounding each of said one or more electronic display subassemblies, wherein said closed loop pathway comprises:
the gap of each respective electronic display subassembly; and
a common cavity located in the space between the first and second electronic display subassemblies and the frame;
a plate positioned within the cavity between and substantially parallel to the rear surfaces of the electronic display subassemblies, wherein said plate is configured to receive at least some of said peripheral devices;
an open loop pathway configured to permit ambient air to pass through said housing and thermally interact with said closed loop pathway without mixing with circulating gas traveling through said closed loop pathway; and
at least two peripheral devices located within said housing, wherein one of said peripheral devices comprises a charging subassembly, and at least one other of said peripheral devices is selected from the group consisting of: a camera, a touchscreen, an additional electronic display, video communications equipment, audio communications equipment, and an emergency notification subassembly.

2. The assembly of claim 1 wherein:
said charging subassembly comprises a number of adapters configured to charge a number of different types of personal electronic devices.

3. The assembly of claim 2 wherein:
said adapters are all male adapters.

4. The assembly of claim 2 wherein:
said adapters are all female adapters.

5. The assembly of claim 2 wherein:
said adapters comprise male and female adapters.

6. The assembly of claim 2 wherein:
each of the adapters comprises a cord which permits the respective adapter to extend from said housing.

7. The assembly of claim 6 wherein:
said cords extend from a common cord which extends from said housing.

8. The assembly of claim 1 wherein:
an exterior surface of said charging subassembly is placed substantially flush with said housing.

9. The assembly of claim 1 further comprising:
a wire harness comprising a number of wires placed in electrical connection with a power source, a communications network, and the peripheral devices.

10. The assembly of claim 9 wherein:
the wire harness comprises a common point for disconnection and reconnection.

11. The assembly of claim 10 wherein:
the common point is located on the pass-through device.

12. The assembly of claim 1 wherein:
said plate comprises a server rack.

13. The assembly of claim 1 wherein:
the hinging device comprises:
a pin;
a first hinge plate mounted to the frame;
a second hinge plate mounted to the respective electronic display subassembly; and
apertures in the first hinge plate and second hinge plate sized and located to permit the pin to pass therethrough.

14. The assembly of claim 1 wherein:
said open loop pathway passes through each of the electronic display subassemblies.

15. An electronic display assembly comprising:
a housing;
a frame having inner and outer surfaces and configured to receive said housing;
a pass-through device located in said housing and configured to accept a power line and a communications network line;
at least one electronic display subassembly mounted to the frame and comprising:
a transparent layer;
an electronic display layer;
a hinging device configured to permit the electronic display subassembly to rotate between an opened and a closed position; and
a gap defined by the space between the transparent layer and the electronic display layer;
at least two peripheral devices wherein one of said peripheral devices is a charging subassembly, and at least one other of said peripheral devices is selected from the group consisting of: a camera, a touchscreen, an additional electronic display, video communications equipment, audio communications equipment, and an emergency notification subassembly;

a sealed closed loop pathway comprising:
  the gap; and
    a cavity defined by a rear surface of the electronic display subassembly and the housing;
    a plate positioned within the cavity substantially parallel to the rear surface of the electronic display subassembly, wherein said plate is configured to receive at least some of said peripheral devices; and
  an open loop pathway configured to permit ambient air to pass through said housing and thermally interact with said closed loop pathway without mixing with circulating gas traveling through said closed loop pathway.

16. The assembly of claim 15 wherein:
  the electronic display subassembly further comprises:
    a backlight located behind the electronic display layer; and
    a corrugated layer located behind a rear surface of the backlight; and
  said open loop pathway comprises said corrugated layer.

17. The assembly of claim 15 wherein:
  said electronic display subassembly further comprises a touch input layer located in the electronic display subassembly.

18. The assembly of claim 15 wherein:
  said charging subassembly comprises a number of adapters configured to charge personal electronic devices;
  said adapters comprise male and female adapters;
  each of the adapters comprises a cord which permits the respective adapter to extend from said housing; and
  said cords extend from a common cord which extends from said housing.

19. An electronic display assembly comprising:
  a housing;
  a frame having inner and outer surfaces and configured to receive said housing;
  a pass-through device located in said housing and configured to accept a power line and a communications network line;
  a first and second electronic display subassembly mounted to the frame in a back to back arrangement, wherein each electronic display subassembly comprises:
    a transparent layer;
    an electronic display layer;
    a hinging device configured to permit the electronic display subassembly to rotate between an opened and a closed position;
    a gap defined by the space between the transparent layer and the electronic display layer; and
    at least two peripheral devices wherein one of said peripheral devices is a charging subassembly, and at least one other of said peripheral devices is selected from the group consisting of: a camera, a touchscreen, an additional electronic display, video communications equipment, audio communications equipment, and an emergency notification subassembly;
  a sealed closed loop pathway comprising:
    the gap of each respective electronic display subassembly; and
    a cavity defined by a rear surface of the electronic display subassembly and the housing;
    a plate positioned within the cavity substantially parallel to the rear surface of the electronic display subassembly, wherein said plate is configured to receive at least some of said peripheral devices; and
  an open loop pathway configured to permit ambient air to pass through said housing and thermally interact with said closed loop pathway without mixing with circulating gas traveling through said closed loop pathway;
  wherein each of said charging subassemblies comprises:
    a number of adapters configured to charge personal electronic devices; and
    a number of cords, each extending to one of said number of adapters.

* * * * *